(12) United States Patent  
Ogawa et al.

(10) Patent No.: US 8,711,523 B2
(45) Date of Patent: Apr. 29, 2014

(54) STACKED MAGNETORESISTANCE DEVICE RESPONSIVE TO A MAGNETIC FIELD GENERALLY PERPENDICULAR TO A SIDE FACE RUNNING ALONG A CHANNEL OF THE DEVICE

(75) Inventors: Susumu Ogawa, Tokyo (JP); David Williams, Cambridge (GB); Hiroshi Fukuda, Tokyo (JP); Katsuyoshi Washio, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 597 days.

(21) Appl. No.: 12/915,648

(22) Filed: Oct. 29, 2010

(65) Prior Publication Data

US 2011/0102947 A1 May 5, 2011

(30) Foreign Application Priority Data

Oct. 30, 2009 (EP) .................................. 09174576

(51) Int. Cl.
*G11B 5/33* (2006.01)
(52) U.S. Cl.
USPC .......................................................... 360/313
(58) Field of Classification Search
None
See application file for complete search history.

(56) References Cited

U.S. PATENT DOCUMENTS

| 2002/0097531 | A1* | 7/2002 | Inoue et al. ................... 360/317 |
| 2002/0126421 | A1 | 9/2002 | Takahashi et al. |
| 2006/0022672 | A1 | 2/2006 | Chattopadhyay et al. |
| 2006/0243971 | A1* | 11/2006 | Iechi et al. ...................... 257/40 |
| 2007/0064351 | A1* | 3/2007 | Wang et al. ................. 360/324.2 |
| 2009/0017573 | A1* | 1/2009 | Mouli .............................. 438/59 |
| 2009/0073615 | A1 | 3/2009 | Gurney et al. |
| 2009/0190269 | A1 | 7/2009 | Boone, Jr. et al. |
| 2009/0218563 | A1 | 9/2009 | Gurney et al. |

FOREIGN PATENT DOCUMENTS

| EP | 1 868 254 A1 | 12/2007 |
| EP | 2 133 930 A1 | 12/2009 |
| EP | 2 133 931 A1 | 12/2009 |

OTHER PUBLICATIONS

S. A. Solin, Nanoscopic magnetic field sensor based on extraordinary magnetoresistance, J. Vac. Sci. Technol., Nov./Dec. 2003, pp. 3002-3006, vol. 21, No. 6.

S. A. Solin et al., Enhanced Room-Temperature Geometric Magnetoresistance in Inhomogeneous Narrow-Gap Semiconductors, Science, Sep. 1, 2000, pp. 1530-1532, vol. 289.

Thomas D. Boone et al., Mesoscopic EMR Device Magnetic Sensitivity in $I$-$V$—$I$-$V$ Configuration, IEEE Electron Device Letters, Feb. 2009, pp. 117-119, vol. 30, No. 2.

M. Holz et al., Optimization of the extraordinary magnetoresistance in semiconductor-metal hybrid structures for magnetic-field sensor applications, Physical E 21, 2004, pp. 897-900.

* cited by examiner

*Primary Examiner* — David D Davis
(74) *Attorney, Agent, or Firm* — Antonelli, Terry, Stout & Kraus, LLP.

(57) ABSTRACT

A magnetoresistance device comprises a substrate, an elongate semiconductor channel extending in a first direction and at least two conductive leads providing a set of contacts to the channel. The device may comprise an optional semiconductor shunt in contact with the channel. The optional shunt, channel and set of contacts are stacked relative to the substrate in a second direction which is perpendicular to the first direction and the surface of the substrate. The device has a side face running along the channel. The device is responsive to a magnetic field generally perpendicular to the side face.

19 Claims, 19 Drawing Sheets

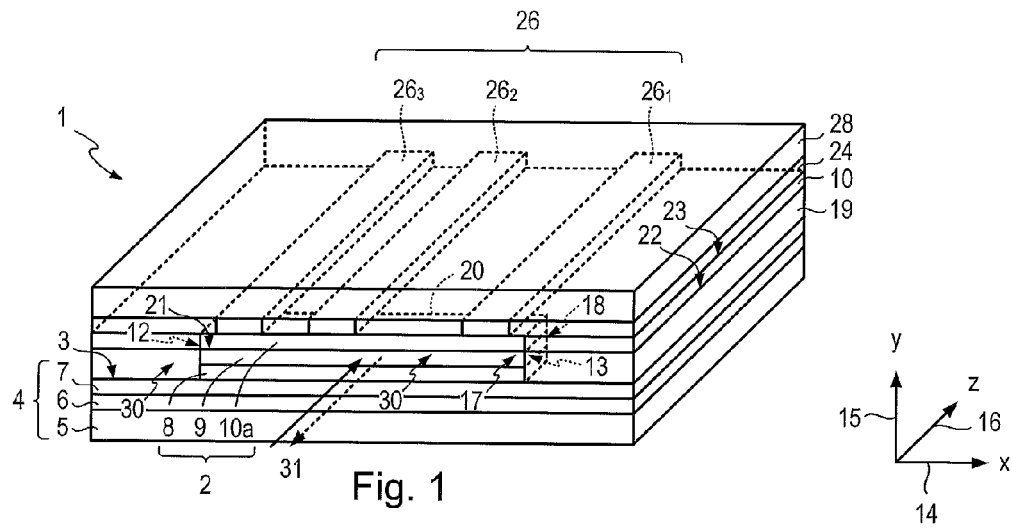
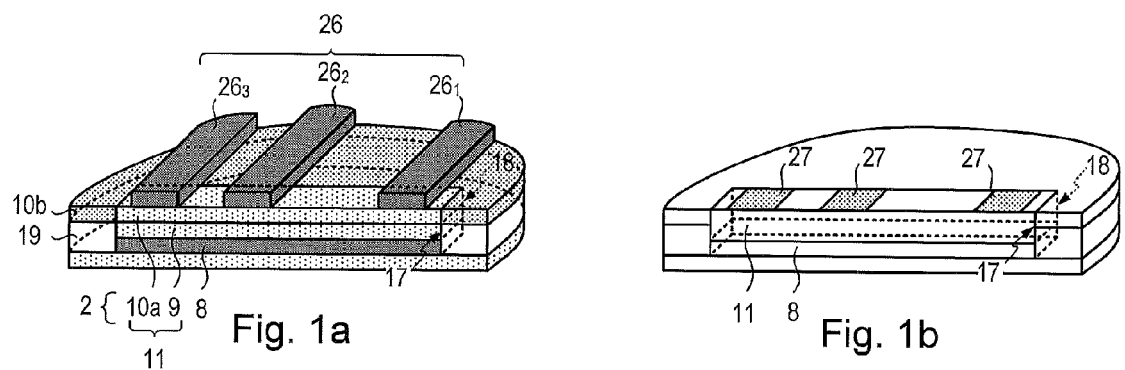
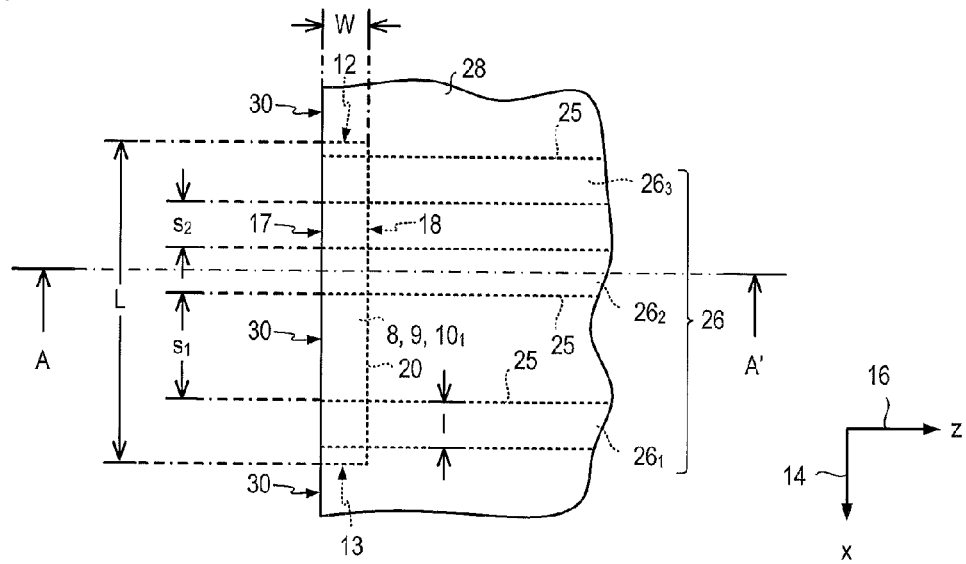
Fig. 2

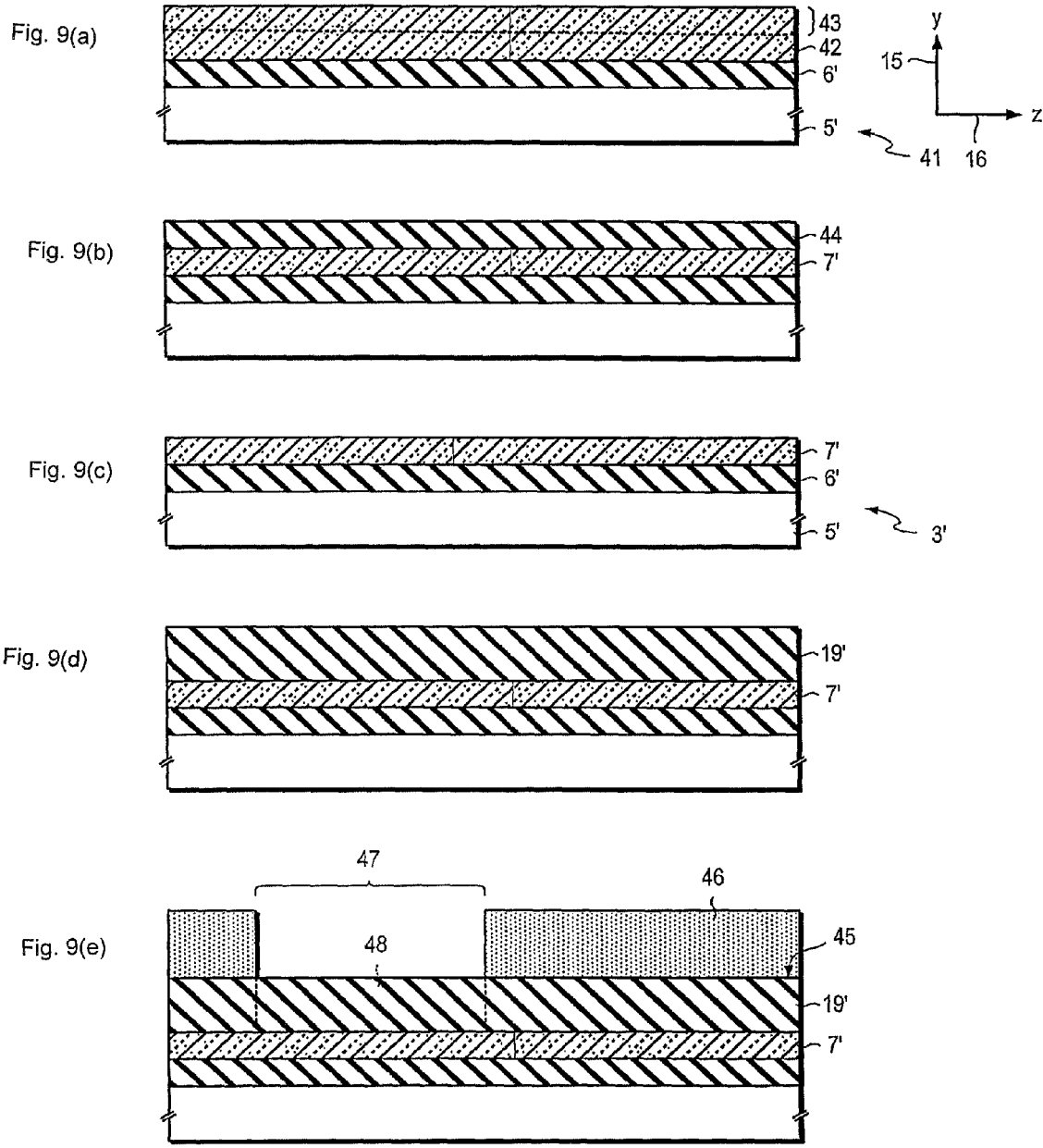

STACKED MAGNETORESISTANCE DEVICE RESPONSIVE TO A MAGNETIC FIELD GENERALLY PERPENDICULAR TO A SIDE FACE RUNNING ALONG A CHANNEL OF THE DEVICE

FIELD OF THE INVENTION

The present invention relates to a magnetoresistance device particularly, but not exclusively, for use as a read head in a hard disk drive.

BACKGROUND

Hard disk drives (HDDs) (or "magnetic disk drives") are widely used for high-density information storage. HDDs are commonly found in computer systems traditionally associated with this type of storage, such as servers and desktop computers. However, HDDs having smaller form factors, such as one-inch drives, can also be found in hand-held electronic devices, such as music players and digital cameras.

Higher storage capacity in HDDs can be achieved by increasing storage density. Storage density is currently doubling roughly every year and the highest storage density presently achievable using conventional technology, such as by recording data in bit cells which are arranged longitudinally in the magnetic recording medium and reading data using so-called "spin value" read heads, is about 100 Gb/in$^2$.

However, as storage density in HDDs continues to increase, then recording media and read heads encounter the problem of the superparamagnetic effect.

The superparamagnetic effect arises when the ferromagnetic grain is sufficiently small that the energy required to change direction of magnetisation of the grain is comparable to the thermal energy. Thus, the magnetisation of the grain is liable to fluctuate and so lead to data corruption.

For recording media, a solution to the problem has been demonstrated which involves arranging bit cells perpendicularly (rather than longitudinally) to the surface of the recording medium which allows each bit cell to be large enough to avoid the superparamagnetic effect.

To address this problem in read heads, it been proposed to avoid using any ferromagnetic material and to take advantage of the so-called extraordinary magnetoresistance (EMR) effect.

A device exhibiting the EMR effect is described in "Enhanced Room-Temperature Geometric Magnetoresistance in Inhomogeneous Narrow-Gap Semiconductors", by S. A. Solin, T. Thio, D. R. Hines and J. J. Heremans, Science volume 289, p. 1530 (2000). The device is arranged in a van der Pauw configuration and includes a highly conductive gold inhomogeneity concentrically embedded in a disk of non-magnetic indium antimonide (InSb). At zero applied magnetic field (H=0), current flows through the gold inhomogeneity. However, at non-zero applied magnetic field (H≠0), current is deflected perpendicularly to the field-line distribution, around the gold inhomogeneity and through the annulus. This gives rise to a drop in conductance.

Currently, high mobility narrow gap semiconductors with low carrier density, such as indium antimonide ($\mu=7\times10^4$ cm$^2$V$^{-1}$s$^{-1}$ at 300° K), indium arsenide ($\mu_n=3\times10^4$ cm$^2$V$^{-1}$s$^{-1}$ at 300° K) and gallium arsenide ($\mu_n=8.5\times10^3$ cm$^2$V$^{-1}$s$^{-1}$ at 300° K), seem to be the best candidates for EMR-based read heads.

"Nanoscopic magnetic field sensor based on extraordinary magnetoresistance" by S. A. Solin, D. R. Hines, A. C. H. Rowe, J. S. Tsai, and Yu A. Pashkin, Journal of Vacuum Science and Technology, volume B21, p. 3002 (2003) describes a device having a Hall bar-type arrangement having an indium antimonide/indium aluminium antimonide (InSb/In$_{1-x}$Al$_x$Sb) quantum well heterostructure.

A drawback of this device is that it requires a thick (i.e. about 75 nm) passivation layer to protect and confine the active layer as well as an insulating coat in the form of a layer of silicon nitride. This increases the separation between the channel and magnetic media and so reduces magnetic field strength and, thus, the output signal.

Silicon does not require passivation and silicon-based magnetic field sensors exhibiting magnetoresistance are known.

For example, EP 1 868 254 A describes a device exhibiting the EMR effect having a channel formed of silicon. A conductor formed of titanium silicide or highly-doped silicon acts as a shunt and is connected to the channel along one side of the channel. Leads are connected to and spaced along the channel on the opposite side of the channel. Thus, the channel, shunt and leads form a lateral or "planar" EMR device which is responsive to a magnetic field perpendicular to the layers forming the device.

EP 2 133 930 A describes a planar EMR device having a channel formed of silicon and which includes an elongate channel. A shunt is connected to the channel along one side of the channel and a set of leads are connected along the opposite side of the channel. The device also includes a top gate arrangement for forming an inversion layer in the channel.

US 2006/0022672 A1 describes another planar EMR device formed in a III-V heterostructure.

EP 2 133 931 A describes a (non-EMR) magnetoresistance device having a channel formed of silicon. A set of leads are connected to the channel along one side of the channel. A shunt may optionally be provided under the channel. The device also includes a top gate arrangement for forming an inversion layer in the channel.

Planar EMR devices and similar types of planar MR devices, for example which employ the Lorentz force to bend a current path and/or use the Hall effect, are generally incompatible with existing processes used to fabricate magnetic head sliders for HDDs, in particular lapping, which is used to form the air bearing surface.

SUMMARY

The present invention seeks ameliorate this problem.

According to a first aspect of certain embodiments of the present invention there is provided a magnetoresistance device comprising a substrate, an elongate semiconductor channel extending in a first direction and at least two conductive leads providing a set of contacts to the channel, wherein the channel and set of contacts are stacked relative to the substrate in a second direction which is perpendicular to the first direction and the surface of the substrate, wherein the device has a side face running along the channel and the device is responsive to a magnetic field generally perpendicular to the side face.

Thus, the device can provide a "vertical-type" or "stacked" MR device which is compatible with existing slider formation technologies compared with existing planar-type MR devices. In particular, the side face can form part of the air bearing surface.

The device may further comprise a semiconductor shunt in contact with the channel.

The channel may be undoped or the channel may be doped less heavily than the shunt and may have the opposite conductivity type to the leads and/or the shunt. For example, the channel may be p⁻ type. The shunt may be monocrystalline. The shunt may comprise silicon. The shunt may be n⁺ type.

Use of undoped silicon-based materials for the channel and highly-doped silicon-based material for the shunt and lead can result in a magnetoresistance device having a sufficiently high resistance, sufficiently high output signals and sufficiently low Johnson noise.

The device may comprise a conductive layer in contact with an optional shunt, wherein the optional shunt is interposed between the channel and the layer. The conductive layer may comprise silicon. The conductive layer may comprise a top layer of the substrate. The conductive layer may comprise a metal silicide.

The channel may comprise a second semiconductor layer and part of a third semiconductor layer, the second semiconductor layer disposed between an optional shunt and the third semiconductor layer. The second semiconductor layer and the part of the third semiconductor layer may be monocrystalline. The other parts of the third semiconductor layer may be amorphous. The channel may comprise silicon or silicon-germanium.

The device may further comprise a dielectric layer, the dielectric layer having a trench, wherein an optional shunt and at least a part of channel are formed in the trench.

The at least two leads may comprise a semiconductor material and may be n⁺ type. The at least two leads may comprise silicon and/or a metal silicide.

The device may comprise an additional lead, the lead providing a further contact to the channel, wherein the channel is disposed between the further contact and the set of contacts.

The device may further comprise first and second magnetic field shielding layers, wherein an optional shunt, the channel and the set of contacts are disposed between the first and second magnetic field shielding layers.

The substrate may comprise a magnetic head slider substrate, optionally, in the form of an AlTiC substrate.

According to a second aspect of the present invention there is provided a magnetic head slider for a magnetic disk drive, the slider comprising the device.

According to a third aspect of certain embodiments of the present invention there is provided a magnetic disk drive comprising a housing, a magnetic media mounted within the housing, the magnetic head slider, wherein the slider is held within the housing for movement adjacent to the magnetic media.

According to a fourth aspect of certain embodiments of the present invention there is provided a method of fabricating a magnetoresistance device, the method comprising providing a substrate having a surface, forming an elongate semiconductor channel, wherein the channel extends in a first direction and forming at least two leads providing a set of contacts to the channel such that the channel and the set of contacts are stacked on the substrate in a second direction which is perpendicular to the first direction and the surface of the substrate, the method further comprising forming a face running alongside the channel and wherein the device is responsive to a magnetic field generally perpendicular to the face.

The method may further comprise forming a semiconductor shunt on the surface of the substrate on the surface of the substrate.

The method may further comprise forming a dielectric layer on the surface of the substrate, wherein the dielectric layer has a trench therein which exposes the surface of the substrate and selectively forming a shunt or the channel on the substrate.

The substrate may comprise a top semiconductor layer and the method may further comprise selectively forming a first semiconductor layer on the top semiconductor layer. Selectively forming the first semiconductor layer may comprise epitaxially growing the first semiconductor layer on the top semiconductor layer.

The method may further comprise selectively forming a second semiconductor layer on the first semiconductor layer or on the substrate. Selectively forming the second semiconductor layer may comprise epitaxially growing the second semiconductor layer channel.

The method may comprise forming a third semiconductor layer over the second or third semiconductor layer and the dielectric layer, wherein a part of the third semiconductor layer is formed on the second or third semiconductor layer. The second semiconductor layer and the part of the third semiconductor layer may be monocrystalline. The other parts of the third semiconductor layer may be amorphous.

The method may further comprise forming a second dielectric layer on the third semiconductor layer, wherein the second dielectric layer has a set of trenches therein which exposes the surface of the third semiconductor layer and selectively forming the leads on the third semiconductor layer.

Forming the leads may comprise depositing a fourth semiconductor layer. Forming the leads may comprise siliciding the fourth semiconductor layer.

The method may comprise sacrificing at least part of the substrate. The device may comprise a stacked structure formed on the substrate and the method may further comprise bonding another substrate onto the stacked structure.

Forming the face comprises lapping an edge of the device.

According to a fifth aspect of certain embodiments of the present invention there is provided a method of fabricating a magnetic head slider comprising fabricating the magnetoresistance device.

BRIEF DESCRIPTION OF THE DRAWINGS

Some embodiments of the present invention will now be described, by way of example, with reference to the accompanying drawings in which:

FIG. 1 is a schematic perspective view of a first magnetoresistance device;

FIG. 1a is a more detailed schematic perspective view of a shunt, channel layers and leads of the first magnetoresistance device shown in FIG. 1;

FIG. 1b is a more detailed schematic perspective view of a shunt, channel and contact regions of a first magnetoresistance device shown in FIG. 1;

FIG. 2 is a plan view of the first magnetoresistance device shown in FIG. 1;

DETAILED DESCRIPTION OF CERTAIN EMBODIMENTS

Figure 3:
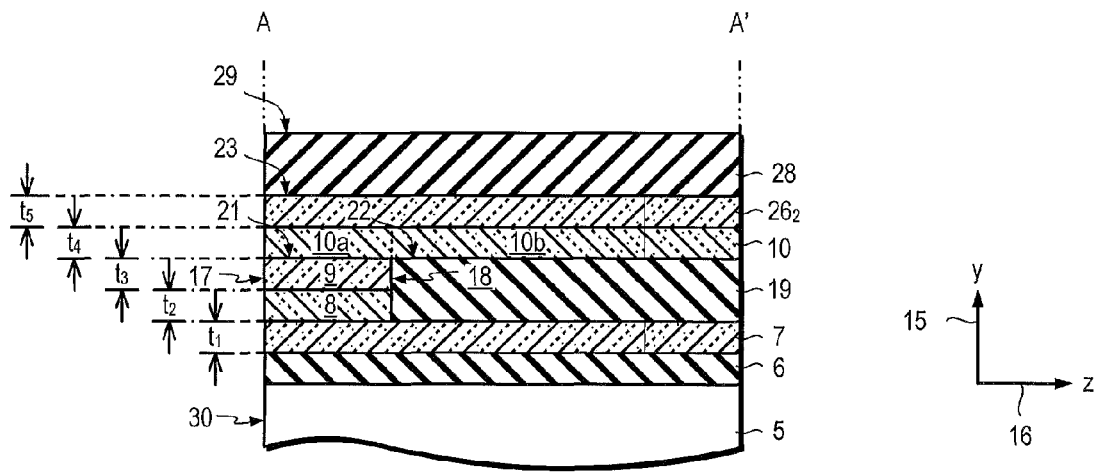
FIG. 3 is a cross-sectional view of the first magnetoresistance device shown in FIG. 2 taken along the line A-A'.

First Magnetoresistance Device 1
Device Structure

Referring to FIGS. 1, 1a, 1b, 2 and 3, a first magnetoresistance device 1 is shown.

The device 1 includes a layer structure 2 disposed on a surface 3 of a generally-planar substrate 4. The substrate 4 takes the form of a semiconductor-on-insulator substrate which includes a semiconductor base 5 (herein also referred to as a "handle layer"), a buried insulator layer 6 and a semiconductor top layer 7 having a thickness, $t_1$. As will be explained in more detail later, the semiconductor surface layer 7 is used a seed layer for epitaxial growth of subsequent layers 8, 9, 10a. The semiconductor base 5 and buried insulator 6 can be sacrificed later. Another substrate 64 (FIG. 19) can be bonded onto a face 65 (FIG. 19) on the opposite side of the rest of the device.

In this example, a silicon-on-insulator substrate 4 is used. Thus, the semiconductor base 5 comprises silicon (Si), the buried insulator 6 comprises silicon dioxide ($SiO_2$) and the seed layer 7 comprises monocrystalline silicon (Si). In this example, the seed layer 7 has a thickness, $t_1$, of about 1 nm.

The layer structure 2 includes a first layer 8 of semiconductor material having a thickness, $t_2$, grown on the seed layer 7, a second layer 9 of semiconductor material having a thickness, $t_3$ grown on the first semiconductor layer 8 and a portion 10a of a third layer 10 of semiconductor material having at thickness $t_3$ grown on the second semiconductor layer 9. The first and second semiconductor layers 8, 9 and the portion 10a of the third semiconductor layer 10 are epitaxial layers and are monocrystalline. As will be explained in more detail layer, the third semiconductor layer 10 includes another portion 10b which is amorphous.

The first semiconductor layer 8 is $n^+$ type (i.e. n-type and doped to the order of $10^{20}$ cm$^{-3}$ or $10^{21}$ cm$^{-3}$). The second and third semiconductor layers 9, 10 are undoped (i.e. intrinsic) or can be $p^-$ type (i.e. p-type and doped to the order of between about $10^{15}$ cm$^{-3}$ and $10^{18}$ cm$^{-3}$). In some embodiments, the second and third semiconductor layers 9, 10 can be $n^-$ type (i.e. n-type and doped to the order of between about $10^{15}$ cm$^{-3}$ and $10^{18}$ cm$^{-3}$).

The second semiconductor layer 9 and the portion 10a of the third semiconductor layer 10 form an active sensor channel 11. Thus, the second semiconductor layer 9 and the portion 10a of the third semiconductor layer 10 are herein referred to as first and second channel layers 9, 10a respectively. The more heavily-doped first semiconductor layer 8 provides a low-resistance conductive region through which current from the channel 11 can be shunted. Thus, the first semiconductor layer 8 is herein referred to as the "shunt layer" or simply the "shunt". For example, the shunt 8 may be doped with arsenic (As) to a concentration of the order of $10^{20}$ cm$^{-3}$ or $10^{21}$ cm$^{-3}$. In some embodiments, the first semiconductor layer 8 (i.e. the shunt) may be omitted.

In this example, the shunt and channel layers 8, 9, 10a are all formed of silicon (Si). However, the shunt layer 8 and/or the channel layers 9, 10a can be formed of silicon-germanium ($Si_{1-x}Ge_x$), for example, having about 10% germanium content (i.e. x=0.1).

The shunt 8 has a thickness, $t_2$, of about 1 nm and the first channel layer 9 has a thickness, $t_3$, of about 1 nm.

The shunt and channel layers 8, 9, 10a may each have a thickness between about 1 and 10 nm. However, the layers 8, 9, 10a are preferably made as thin as possible so as to decrease device resistance.

The channel 11 is generally elongate having a length, L, between first and second ends 12, 13 in a first, longitudinal direction 14 (herein labelled as the x-axis). In this example, the length, L, is about 150 nm. First, second and third directions 14, 15, 16 are orthogonal. The second direction 15 is the direction in which layers are stacked (herein labelled as the y-axis). The second direction 15 is normal to the surface 3 of the substrate 4. Herein, the second direction 15 is also referred to as the "vertical direction" or "stack direction". The channel 11 has a width, W, between first and second edges (or "sides") 17, 18 in the third direction 16 (herein labelled as the z-axis). In this example, the width, W, is about 10 nm. The shunt and channel layers 8, 9, 10a are generally co-extensive (in plan view) and so the shunt 8 has substantially the same lateral dimensions (i.e. in x- and z-directions) as the channel 11.

The substrate 4 also supports a first patterned layer 19 of deposited dielectric material (herein referred to simply as the "first dielectric layer") which includes an elongate recessed step 20 (or open-sided "slot" or "trench") orientated along the first direction 14. The shunt 8 and first channel layer 9 are formed in the trench 20. The combined thickness of the shunt 8 and the first channel layer 9 is same as the thickness of the first dielectric layer 19. Therefore, the surface 21 of the first channel layer 9 and the surface 22 the first dielectric layer 19 are level. In this example, the dielectric material comprises silicon dioxide ($SiO_2$).

The third semiconductor layer 10 is formed over the surfaces 21, 22 of the first channel layer 9 and the first dielectric layer 19 and has an upper surface 23. The third semiconductor layer 10 comprises silicon, although silicon-germanium can be used. In this example, the third semiconductor layer 10 has a thickness, $t_4$, of about 1 nm.

As mentioned earlier, the third semiconductor layer 10 comprises crystalline and amorphous regions 10a, 10b depending on the underlying material. Thus, the part 10a of the third semiconductor layer 10 which overlies the first channel layer 9 is monocrystalline, but the other part 10b which lies over the first dielectric layer 19 is amorphous.

The third semiconductor layer 10 supports a second patterned layer 24 of deposited dielectric material (herein referred to simply as the "second dielectric layer") which includes three elongated trenches 25 which lie perpendicularly to the elongate channel 11, i.e. orientated along the third direction 16. The second patterned layer 24 comprises silicon dioxide ($SiO_2$). In this example, the second dielectric layer 24 has a thickness of about 1 nm.

Referring also to FIG. 1a (in which the second dielectric layer 24 is omitted for clarity), the third semiconductor layer 10 also supports a set of conductive leads 26, namely first, second and third conductive leads $26_1$, $26_2$, $26_3$. The leads 26 are formed in respective trenches 25 of the second dielectric layer 24. The leads 26 are spaced apart along the channel 11 (along the x-axis 14) orientated perpendicular to the channel (along the z-axis 16). The first and second leads $26_1$, $26_2$ are separated by a length, $s_2$, of about 30 nm. The second and third leads $26_2$, $26_3$ are separated by a length, $s_2$, of about 30 nm. However, as shown in FIG. 1, the first and second leads $26_1$, $26_2$ can be separated more than the second and third leads $26_2$, $26_3$, i.e. $s_1 > s_2$. The leads 26 have a length, l, (i.e. along the first direction 14) of about 30 nm.

Each lead 26 may comprise a layer of highly-doped semiconductor. In this example, the semiconductor is silicon. The leads 26 preferably have the same conductivity type as the shunt 8. In this example, the leads 26 are n-type. For example, the leads 26 may be doped with arsenic (As) to a concentration of about $1 \times 10^{20}$ cm$^{-3}$. In this example, the leads 26 have a thickness, $t_5$, of about 20 nm, but can be as thin as about 1 nm.

The leads 26 may comprise a metal-semiconductor alloy so as to increase conductivity. For example, in the case of silicon, the leads 26 may be silicided by depositing a thin layer of nickel, titanium or tungsten, annealing at about 500° C. and wet-etching unreacted metal.

Referring also to FIG. 1b, the leads 26 start at the first edge 17 of the channel 11 and run over channel 11 and over the second edge 18 of the channel 11 in the third direction 16. Between the first and second edges 17, 18 of the channel 11, the leads 26 provide interfaces or contacts 27 to the channel 11.

Referring again to FIGS. 1, 2 and 3, the second dielectric layer 24 and the leads 26 are covered by a third layer 28 of deposited dielectric material ("third dielectric layer 28") having an exposed surface 29. The third dielectric layer 28 comprises silicon dioxide ($SiO_2$).

As will be explained in more detail later, further layers can be deposited or bonded to the surface 29 of the dielectric layer 28 (or on top other layers on the dielectric layer 28), including further dielectric layers, magnetic shield layers and/or a new substrate.

The device 1 has a face 30 which is substantially flat and which lies in a plane which is parallel to the first and second directions 14, 15, i.e. parallel to the channel 8 and to the direction in which layers are stacked. Thus, the first edge 17 of the channel 11 runs along the face 30. Herein, the face is referred to as a "side face". The side face 30 may be covered by a protective layer (not shown) of dielectric material. This can include a layer silicon dioxide ($SiO_2$) which may form naturally.

Figure 14:
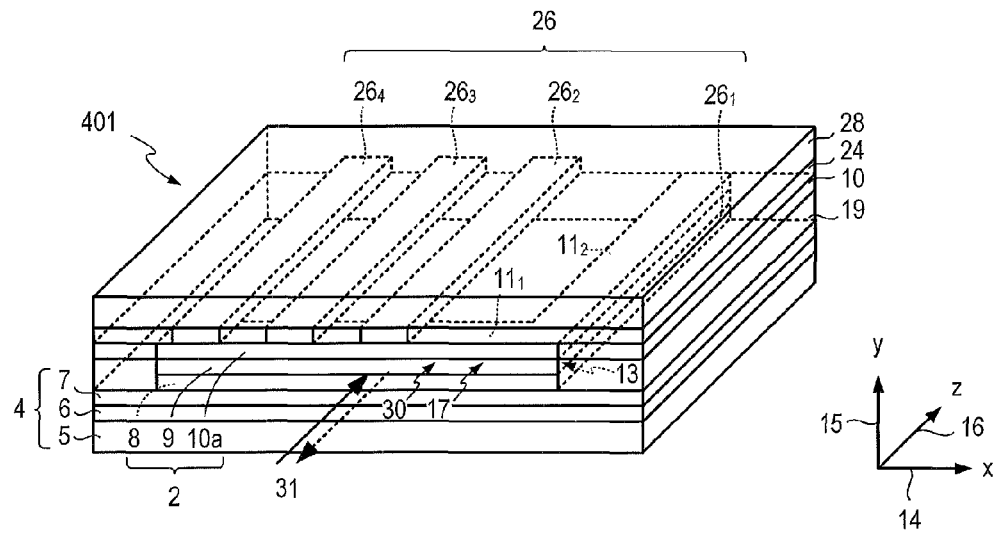
FIG. 14 is a schematic perspective view of a fourth magnetoresistance device.

In operation, the device 1 exhibits an extraordinary magnetoresistance (EMR) effect and can be used as a magnetic field sensor to detect a magnetic field 31 passing perpendicularly or nearly perpendicularly (i.e. a few degrees off perpendicular) to the side face 30, i.e. parallel (or anti-parallel) or nearly parallel (or nearly anti-parallel) to the z-axis 16. In FIG. 14, a magnetic field 31 is shown passing into the page. However, the magnetic field can pass out of the page.

Figure 27:
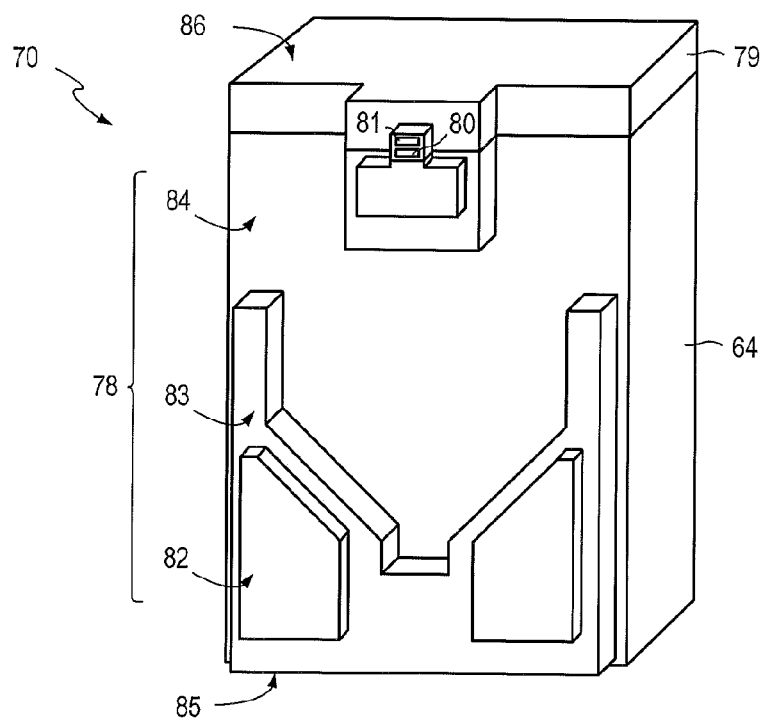
FIG. 27 is a schematic perspective view of a slider.
Figure 28:
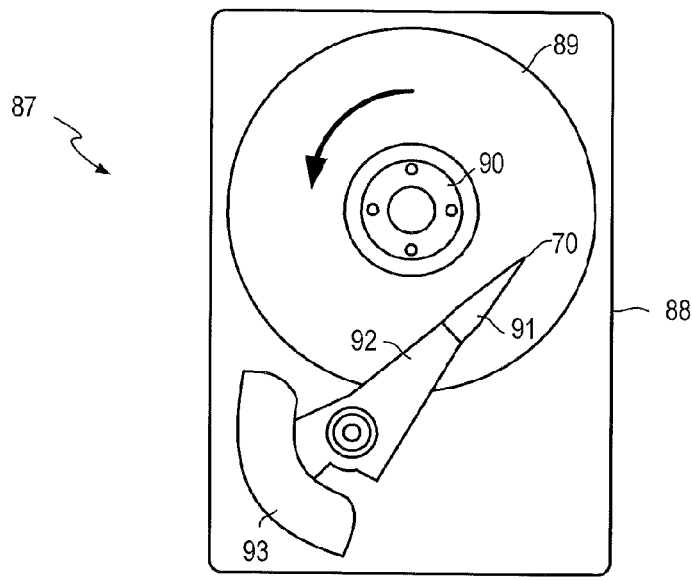
FIG. 28 is a schematic plan view of a magnetic disk drive.

As will be explained in more detail later, the device 1 can be used as a read head 80 (FIG. 27) in a magnetic disk drive 87 (FIG. 28). The arrangement of shunt 8 (if present), channel 11 and leads 26 allows the device 1 to be integrated into a magnetic head slider 70 (FIG. 27) using current slider fabrication technologies, such as lapping. Lapping is used to define the surface, referred to as the air bearing surface (ABS), which faces the magnetic media 89 (FIG. 28). Thus, the device 1 can be incorporated into a slider whereby the side face 30 of the device 1 is formed by lapping and forms part of the air bearing surface. Because the device 1 is responsive to magnetic fields 31 passing perpendicularly to the side face 30, the device 1 is correctly orientated to detect magnetic fields which originate from the magnetic media 89 (FIG. 28).

Device Operation

Figure 4:
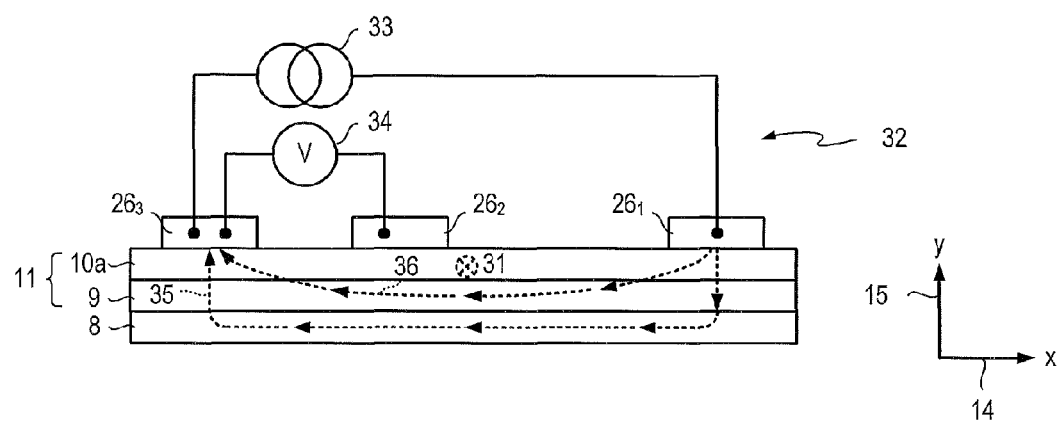
FIG. 4 is a schematic view of circuit arrangement for operating the first magnetoresistance device shown in FIG. 1.

Referring in particular to FIG. 4, a circuit 32 for operating the magnetoresistance device 1 is shown. The circuit 32 includes a current source 33 configured to drive current, I, through the shunt 8 and channel 11 between the first and third leads $26_1$, $26_3$ and a voltmeter 34 configured to measure voltage, V, developed across the second and third leads $26_2$, $26_3$. In an alternate configuration, the current source 33 can be configured to drive current between the first and second leads $26_1$, $26_3$.

In the absence of an applied magnetic field 31, the current through first and third leads $26_1$, $26_3$ flows into the channel 11 and is shunted, through the shunt 8, along a path 35. When a magnetic field 31 is applied along the z-axis 16 (FIG. 1), the current is deflected from shunt 8 and passes through the channel 11 along path 36. The change in electrical resistance due to the applied magnetic field 31 is detected across the voltage leads $26_2$, $26_3$.

Figure 5:
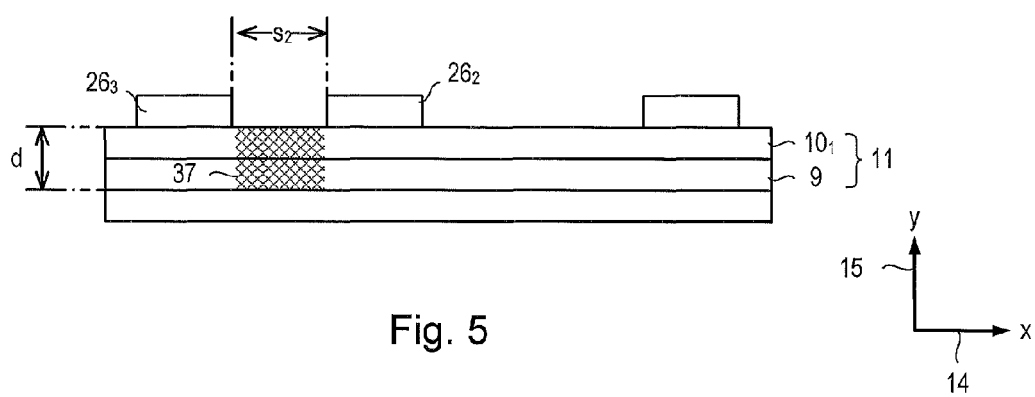
FIG. 5 illustrates a sensitive region of the first magnetoresistance device shown in shown in FIG. 1.

Referring to FIG. 5, a sensitive area 37 for the applied magnetic field 31 lies in the undoped or lightly-doped channel 11 between the second and third leads $26_2$, $26_3$. Thus, a lead spacing, $s_2$, of about 30 nm and a combined layer thickness, $d = t_3 + t_4$, can be used to detect bits in a magnetic media 89 (FIG. 28) having a similar size which corresponds to a storage density of around 10 Tb/in$^2$.

Figure 6:
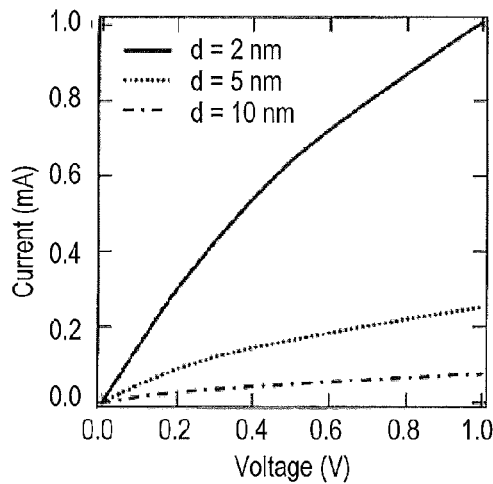
FIG. 6 illustrates simulated current-voltage characteristics of the first magnetoresistance device shown in FIG. 1 for three different values of layers thickness.

FIG. 6 shows an ATLAS simulation of current-voltage curve for the device having three different values of channel thickness, d, namely d=2 nm, d=5 nm and d=10 nm. In this model, the lead widths, $l_1$, $l_2$, and $l_3$, are the same, i.e. $l_1 = l_2 = l_3 = 30$ nm and the lead separations, $s_1$ and $s_2$, are also the same, namely $s_1 = s_2 = 30$ nm. The width, W, of the shunt 8 is 10 nm.

Figure 7:
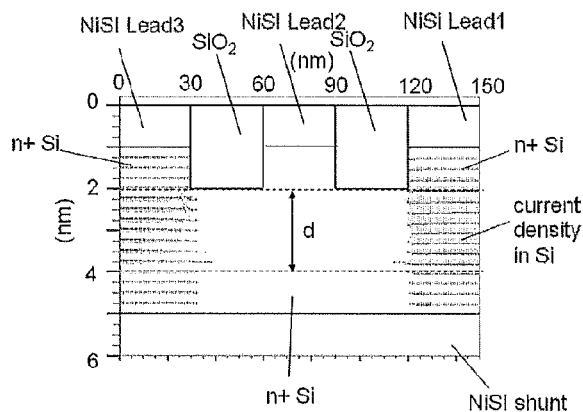
FIG. 7 illustrates a simulated current density characteristic of the first magnetoresistance device shown in FIG. 1.

FIG. 7 shows an ATLAS simulation of current density for the same device, when d=2 nm. As shown in FIG. 7, current mainly flows between the leads 26 and the shunt 8. The resistance, R, between the first and second leads $26_1$, $26_2$, is about 1 kΩ.

Figure 8:
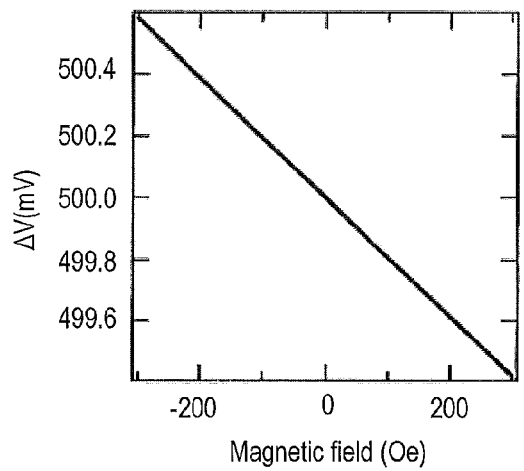
FIG. 8 illustrates a simulated magnetoresistance characteristic of the magnetoresistance device shown in FIG. 1.

FIG. 8 shows an ATLAS simulation of output signal as a function of applied magnetic field. Here, a bias of 0V is applied to the first lead $26_1$, and a bias of 1 V is applied to the third lead $26_3$ and voltage difference between the second and third leads $26_2$, $26_3$ is measured for a range of applied magnetic fields applied along the z axis 16 (FIG. 1). The simulation and linear extrapolation from measurements of larger devices (not shown) indicate that the output signal for the device is around 2 μV/Oe.

Device Fabrication

Figure 9F:
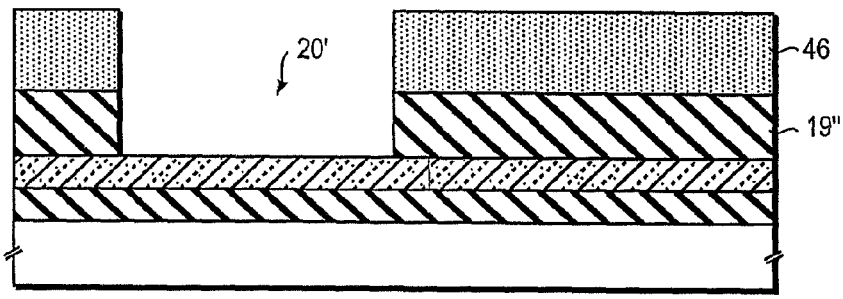
FIGS. 9a to 9r illustrate fabrication of the first magnetoresistance device at different stages.
Figure 9G:
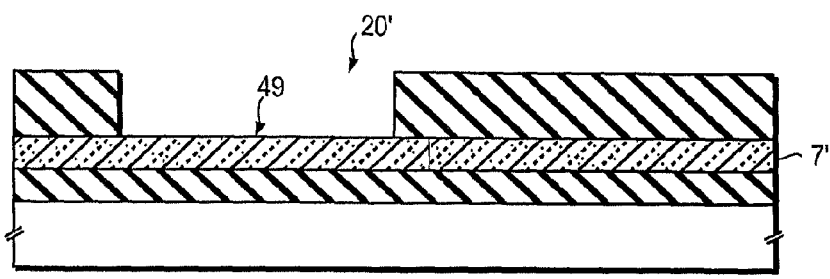
Figure 9H:
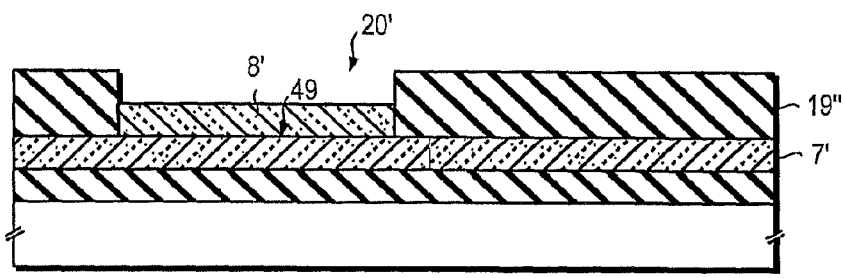
Figure 9I:
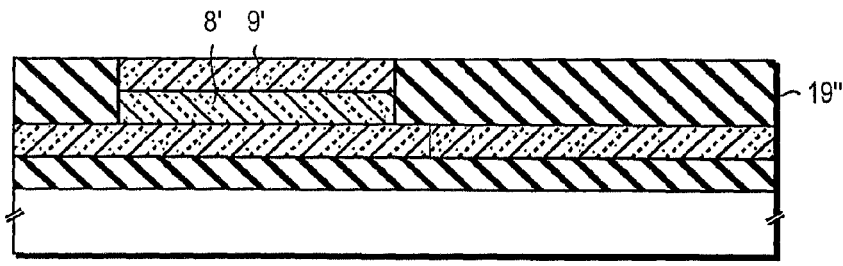
Figure 9J:
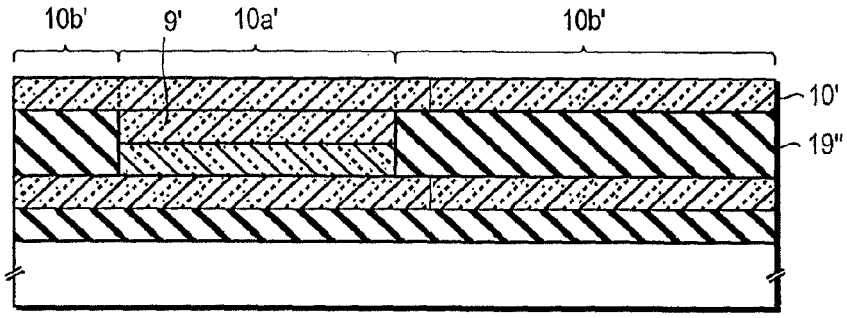
Figure 9K:
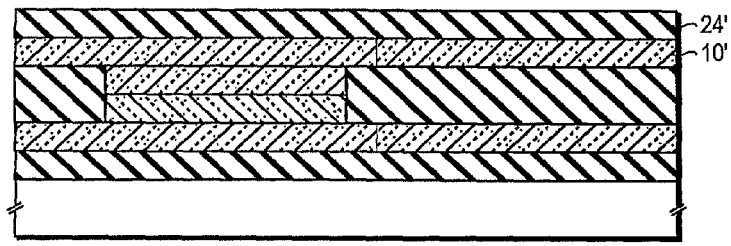
Figure 9L:
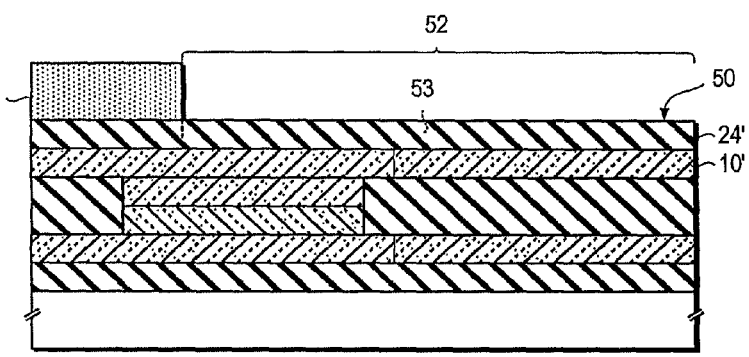
Figure 9M:
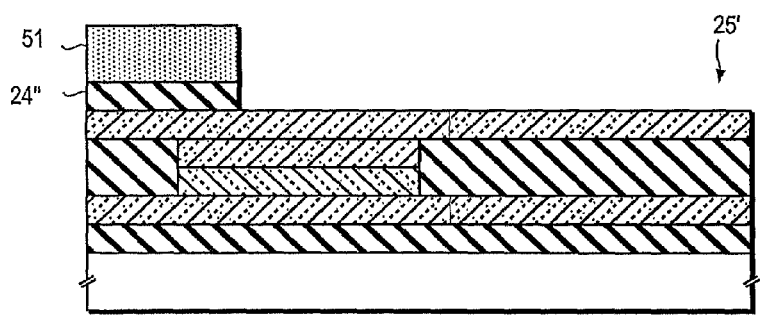
Figure 9N:
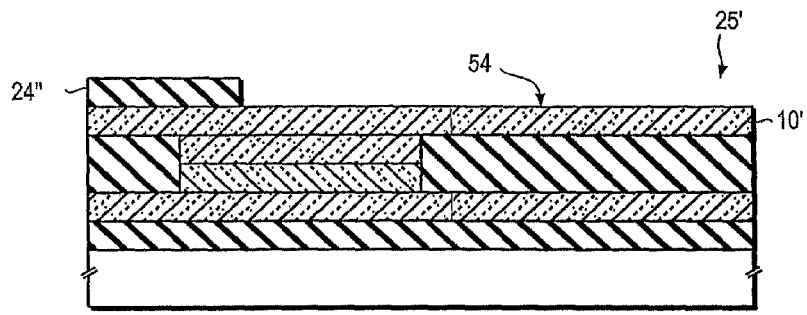
Figure 9O:
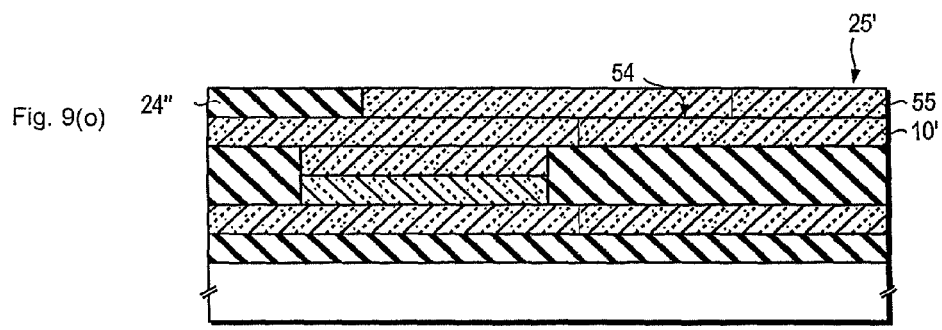
Figure 9P:
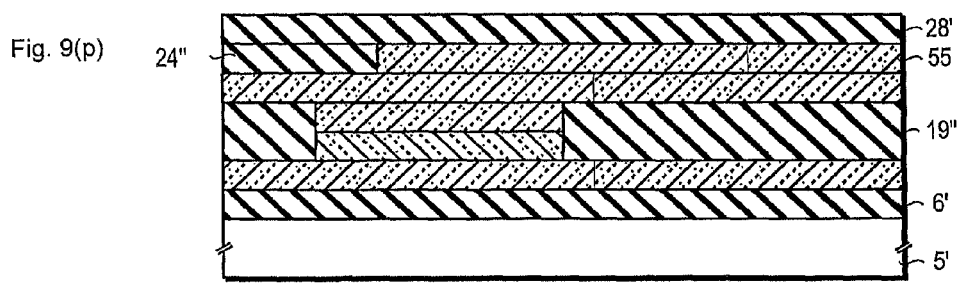
Figure 9Q:
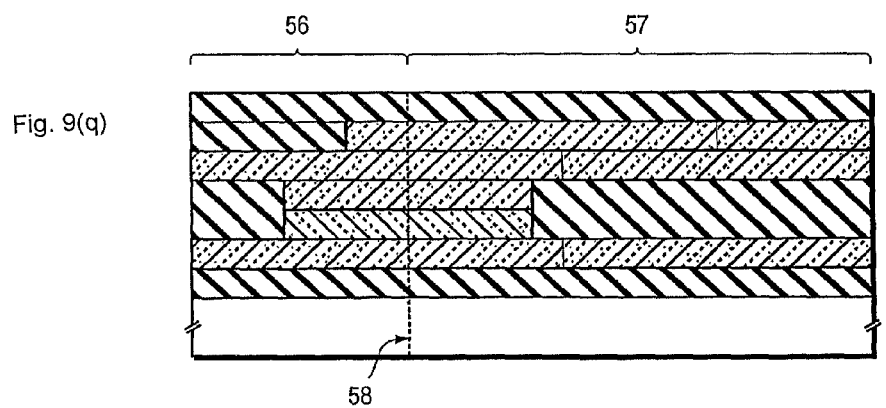
Figure 9R:
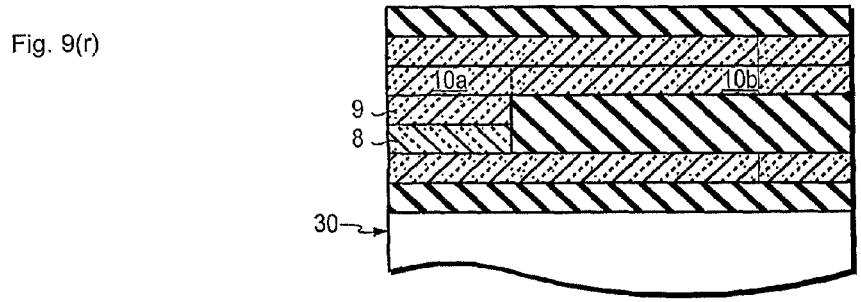

Referring to FIGS. 9a to 9r, a method of fabricating the device 1 will now be described.

Referring to FIG. 9a, the process starts with a semiconductor-on-insulator wafer 41. The wafer 41 has a semiconductor handle layer 5', a buried insulator layer 6' and a top layer 42 of monocrystalline semiconductor. The top semiconductor layer 42 usually has a thickness of a few 10s of nanometres. Such a thick layer 42 is not required and so the layer 42 can be thinned.

In this example, a silicon-on-insulator wafer 41 is used. The top silicon layer 42 typically has a thickness in the range between about 20 nm and 100 nm. To thin the top silicon layer 42, thermal oxidation followed by wet etching can be used. The wafer 41 is thermally oxidized to convert a surface region 43 of the top silicon layer 42 into silicon dioxide. As shown in FIG. 9b, this leaves a layer 44 of silicon dioxide on a thin layer 7' of monocrystalline silicon, hereinafter referred to as the seed layer 7'. The silicon dioxide layer 44 can be removed using a mixture of 2:5:3 $NH_2F:C_2H_4O_2:H_2O$ (also known as a "SILOX etch").

Referring to FIG. 9c, a wafer 3' ready for layer deposition is shown and includes the seed layer 7' lying on a buried insulator 6' which in turn lies on a handle layer 5'.

Referring to FIG. 9d, a first layer 19' of dielectric material is deposited over the seed layer 7'. In this example, the dielectric material is silicon dioxide and is deposited using chemical vapour deposition (CVD).

Referring to FIG. 9e, a layer (not shown) of electron-beam resist is applied (e.g. spun-on) to an upper surface 45 of the first dielectric layer 19' and cured by baking. The electron-beam resist layer (not shown) is patterned using a scanning electron beam (not shown) and developed using a suitable developer to leave a patterned resist layer 46 which includes an elongate (along the x-direction 14) window 47. The window 47 is about the same length (along the x-direction 14) as the intended shunt and first channel layers 8, 9, but is wider (along the z-direction 16).

A region 48 of the first dielectric layer 19' extending down to the seed layer 7' is removed by wet etching, e.g. using the SILOX etch. The resulting structure is shown in FIG. 9f and includes a wide trench 20' in a patterned first dielectric layer 19".

The patterned resist layer 46 is removed. The resulting structure is shown in FIG. 9g and includes an exposed area 49 of the seed layer 7' at the bottom of the trench 20'.

Referring to FIG. 9h, a first layer 8' of semiconductor material is selectively grown on the exposed area 49 of the seed layer 7' in the trench 20'. The first semiconductor layer 8' is highly doped and has a first conductivity type. In this example, the semiconductor layer 8' is n-type and is doped in-situ during growth. The first semiconductor layer 8' grows epitaxially on the seed layer 7' and so forms a monocrystalline layer. The semiconductor layer 8' does not grow on the patterned first dielectric layer 19". In this example, the semiconductor is silicon and so selective epitaxial growth can be achieved using CVD at about 700° C.

Referring to FIG. 9i, a second layer 9' of semiconductor material is selectively grown on the first semiconductor layer 8'. The second semiconductor layer 9' is undoped or is lightly doped so as to have a second conductivity type. In this example, the semiconductor layer 8' is intrinsic.

The second semiconductor layer 9' grows epitaxially on the first semiconductor layer 8' and forms a monocrystalline layer. The second semiconductor layer 9' does not grow on the patterned first dielectric layer 19". In this example, the semiconductor is silicon, although silicon-germanium can be used. Again, for silicon, selective growth can be achieved using CVD at about 700° C.

Referring to FIG. 9j, a third layer 10' of semiconductor material is grown over the second semiconductor layer 9' and the patterned first dielectric layer 19". The third semiconductor layer 10' is undoped or is lightly doped so as to have a second conductivity type. In this example, the third semiconductor layer 10' is intrinsic.

The third semiconductor layer 10' grows epitaxially on the second semiconductor layer 9' and forms a monocrystalline layer 10a'. However, the third semiconductor layer 10' grows and forms an amorphous layer 10b' on the patterned first dielectric layer 19". In this example, the semiconductor is silicon although silicon-germanium can be used. Unselective growth can be achieved using CVD at about 600° C.

Referring to FIG. 9k, a second layer of dielectric material 24' is grown over the third semiconductor layer 10'. In this example, the dielectric is silicon dioxide, although other dielectric materials such as silicon nitride can be used.

Referring to FIG. 9l, a layer (not shown) of electron-beam resist is applied (e.g. spun-on) to an upper surface 50 of the second dielectric layer 24' and cured by baking. The electron-beam resist layer (not shown) is patterned using a scanning electron beam (not shown) and developed using a suitable developer to leave a patterned resist layer 51 which includes elongate (along the z-direction 16) windows 47.

A region 53 of the second dielectric layer 24' extending down to the third semiconductor layer 10' is removed by wet etching, e.g. using the SILOX etch. The resulting structure is shown in FIG. 9m and includes trenches 25' in a patterned second dielectric layer 24".

The patterned resist layer 51 is removed. The resulting structure is shown in FIG. 9n and includes exposed areas 54 of the third semiconductor layer 10' at the bottom of the trenches 25'.

Referring to FIG. 9o, a fourth layer 55 of semiconductor material is selectively grown on the exposed areas 54 of the third semiconductor layer 10' in the trenches 25'. The fourth semiconductor layer 55 is highly doped and has a first conductivity type. In this example, the semiconductor layer 55 is n-type and is doped in-situ during growth.

The fourth semiconductor layer 55 grows epitaxially on the third semiconductor layer 10' and forms monocrystalline layer. The fourth semiconductor layer 55 does not grow on the patterned second dielectric layer 24". In this example, the semiconductor is silicon. As described earlier, selective growth can be achieved for silicon using chemical vapour deposition at about 700° C.

The fourth semiconductor layer 55 can be left so as to form the leads 26 (FIG. 1). However, the leads can be silicided so as to reduce the resistivity of the leads. This may comprises depositing a suitable metal, such as nickel (Ni), titanium (Ti) or tungsten (W) over the fourth semiconductor layer 55 and the second dielectric layer 24" and annealing so as to form the silicide. For nickel and silicon, annealing can be performed at about 500° C. Unreacted metal (e.g. on the second dielectric layer 24") can be removed using a wet etch.

Referring to FIG. 9p, a third layer of dielectric material 29' is deposited over the fourth semiconductor layer 55 and the second dielectric layer 24". In this example, the dielectric is silicon dioxide, although other dielectric materials such as silicon nitride can be used.

As will be explained later, additional process stages can be carried out, for example, bonding a carrier wafer 64' (FIG. 20b), e.g. formed of aluminium titanium carbide, on top of the third dielectric layer 29' or a layer 60' (FIG. 20b) which lies on the third dielectric layer 29', removing the handle layer 5' and the insulator layer 6', patterning and siliciding the seed layer 7 and forming a protective dielectric layer under the shunt layer and rest of the first dielectric layer 19".

Referring to FIG. 9q, the wafer is cut so to remove a side or edge portion 56 of the wafer from an adjacent part 57 along a line 58 which cuts through the (wide) shunt layer 8' and channel 11'. This can be achieved using a wafer saw for coarse cutting and lapping for fine cutting. However, other forms of cutting can be used such as, for example, ion beam milling. The resulting structure is shown in FIG. 9r, which show the device 1 including the side face 30, shunt 8 and channel layers 9, 10a.

A thin (e.g. equal to or less than 2 nm) protective layer of silicon dioxide or other material may be deposited, grown or allowed to grow so as to cover the side face 30.

As will be explained later, the process of cutting can include formation of bars and lapping the edge of the bar to form the side face 30.

Second Magnetoresistance Device 201

Figure 10:
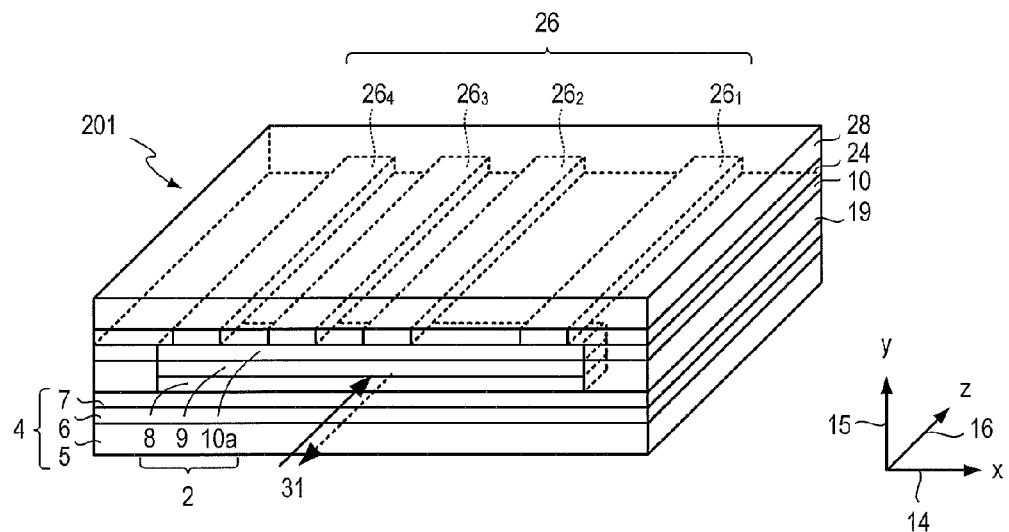
FIG. 10 is a schematic perspective view of a second magnetoresistance device.

Referring to FIG. 10, a second magnetoresistance device 201 is shown.

The second magnetoresistance device 201 is similar to the first magnetoresistance device 1 (FIG. 1) hereinbefore described. Therefore, the same reference numerals are used to refer to the same features.

The second device 201 differs from the first device 1 (FIG. 1) in that there are four leads 26, namely first, second, third and fourth leads $26_1$, $26_2$, $26_3$, $26_4$ (and, thus, four contacts to the channel 11). The spacing, $s_2$, between the third and fourth leads can be the same as the spacing, $s_2$, between the second and third leads. The channel and shunt 8, 11 may be elongated further in order to accommodate the number of leads 26.

Figure 11:
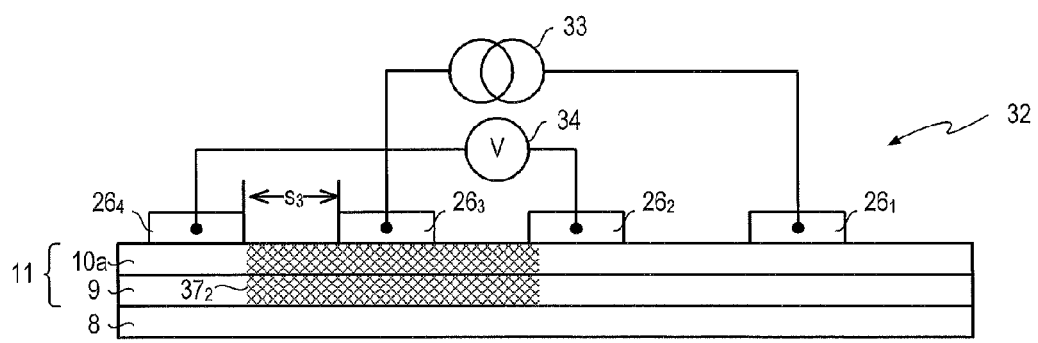
FIG. 11 is a schematic view of circuit arrangement for operating the second magnetoresistance device shown in FIG. 10.

Referring to FIG. 11, the circuit 32 for operating the magnetoresistance device 201 is shown.

The current source 33 is arranged to drive current, I, through the shunt 8 and channel 9 between the first and third leads $26_1$, $26_3$. The voltmeter 34 is configured to measure voltage, V, developed across the third and fourth leads $26_3$, $26_4$.

The output signal for the second device 201 can be twice that for the first device 1 (FIG. 1). However, the sensitive area $37_2$ is wider lying between the second and fourth leads $26_2$, $26_4$.

The second device 201 is fabricated in substantially the same way as the first device 1 (FIG. 1). However, the patterned resist layer 51 (FIG. 9I) has a different pattern, thus resulting in four, rather than three, leads.

Third Magnetoresistance Device 301

Figure 12:
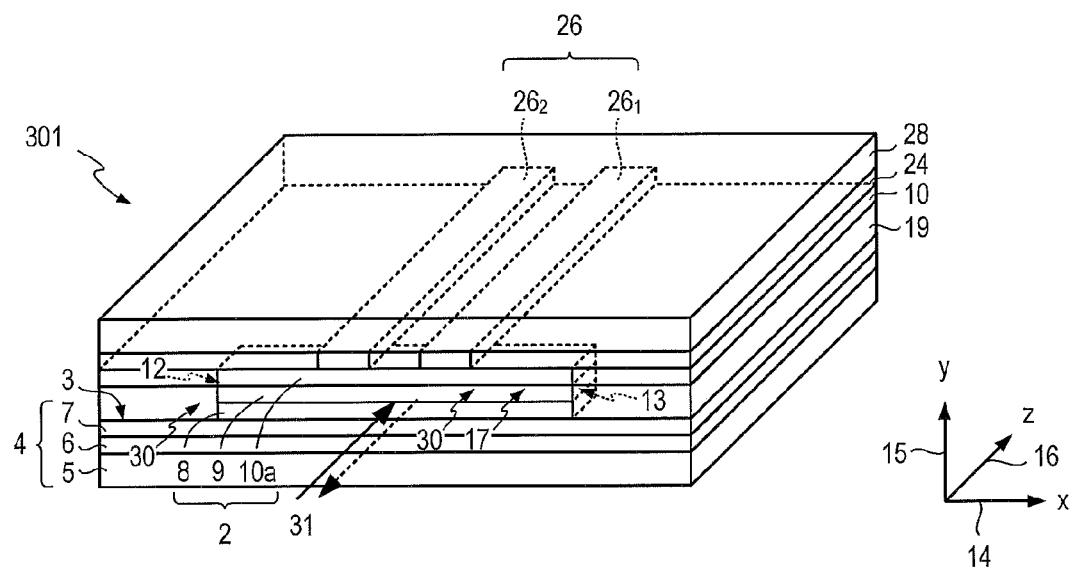
FIG. 12 is a schematic perspective view of a third magnetoresistance device.

Referring to FIG. 12, a third magnetoresistance device 301 is shown.

The third magnetoresistance device 301 is similar to the first magnetoresistance device 1 (FIG. 1) hereinbefore described. Therefore, the same reference numerals are used to refer to the same features.

The third device 301 differs from the first device 1 (FIG. 1) in that there are only two leads 26, namely first and second, leads $26_1$, $26_2$. The spacing, $s_1'$, between the first and second leads can be the same as the spacing, $s_2$, between the second and third leads in the first and second devices. The shunt 8 and channel 11 may be made shorter.

Figure 13:
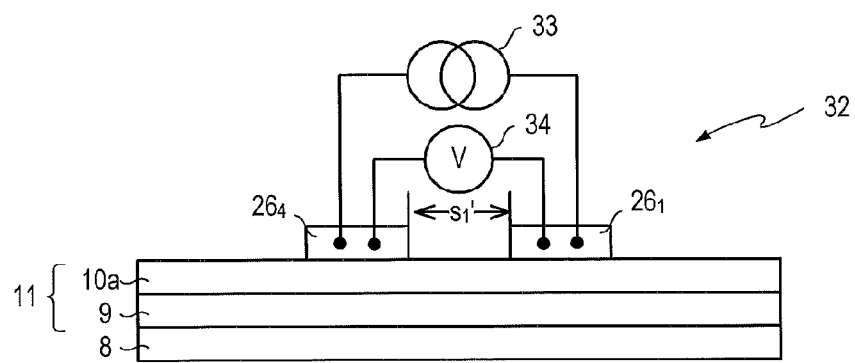
FIG. 13 is a schematic view of circuit arrangement for operating third magnetoresistance device shown in FIG. 12.

Referring to FIG. 13, the circuit 32 for operating the magnetoresistance device 301 is shown.

The current source 33 is arranged to drive current, I, through the shunt 8 and channel 11 between the first and second leads $26_1$, $26_2$. The voltmeter 34 is configured to measure voltage, V, developed across the first and second leads $26_1$, $26_2$.

The output signal for the third device 301 is similar to that for the first device 1 (FIG. 1).

The third device 301 is fabricated in substantially the same way as the first device 1 (FIG. 1). However, the patterned resist layer 51 (FIG. 9I) has a different pattern, thus resulting in two, rather than three, leads.

Fourth Magnetoresistance Device 401

Figure 14A:
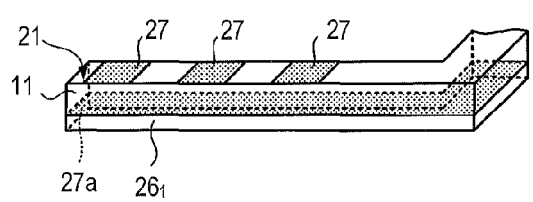
FIG. 14a is a more detailed schematic perspective view of a channel and contact regions of a fourth magnetoresistance device shown in FIG. 14.

Referring to FIGS. 14 and 14a, a fourth magnetoresistance device 401 is shown.

The fourth magnetoresistance device 401 is similar to the second magnetoresistance device 201 (FIG. 10) hereinbefore described. Therefore, the same reference numerals are used to refer to the same features.

The fourth device 401 differs from the second device 201 (FIG. 10) in that the first lead 26, is connected to the shunt 8 and the shunt 8 effectively becomes part of the first lead $26_1$. Thus, the first lead 26, has an 'L'-shape in plan view. Consequently, the channel 11 also has an 'L'-shape in plan view having first and second portions $11_1$, $11_2$ lying along the x-axis and the z-axis respectively.

The second, third and fourth leads $26_2$, $26_3$, $26_4$ provide contacts 27 to the surface 21 of the channel 11 and the first lead $26_1$ provides a contact 27a to the opposite surface of the channel 11. In FIGS. 14 and 14a, the surface 21 is the top of the channel 11 and the opposite surface is the bottom face or underside of the channel. The device 401 can be inverted and incorporated into a slider so that the surface 21 is the underside of the device and the opposite surface is the top relative to a underlying substrate.

In some embodiments, the first semiconductor layer 8 can be omitted and the lead $26_1$ can be provided by a patterned, silicided seed layer 7. This can be used to form a device having a short (along the y-axis) junction region which is provided by the channel 11. Charge can be injected from a contact, for example the bottom of the junction layer, and can be collected by contacts on, for example, the top of the junction layer, thereby forming a form of 'Y'-shaped device. The proportion of charge collected by different contacts is affected by the applied magnetic field.

Figure 14B:
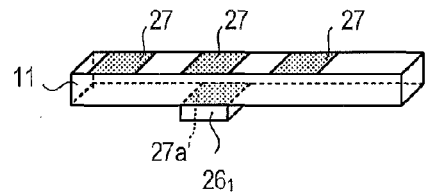
FIG. 14b is a more detailed schematic perspective view of a channel and contact regions of an alternative magnetoresistance device.

Referring to FIG. 14b, the lead $26_1$ may be patterned so that rather than providing a relatively long contact 27a as shown in FIG. 14a, it provides a relatively short contact 27a'.

As the second portion $11_2$ of the channel layer 11 runs perpendicular to the side face 30 and, thus, would be parallel to a magnetic field 31 applied perpendicularly to the side face 30, it does not contribute to the magnetoresistance response of the device 401.

Figure 15:
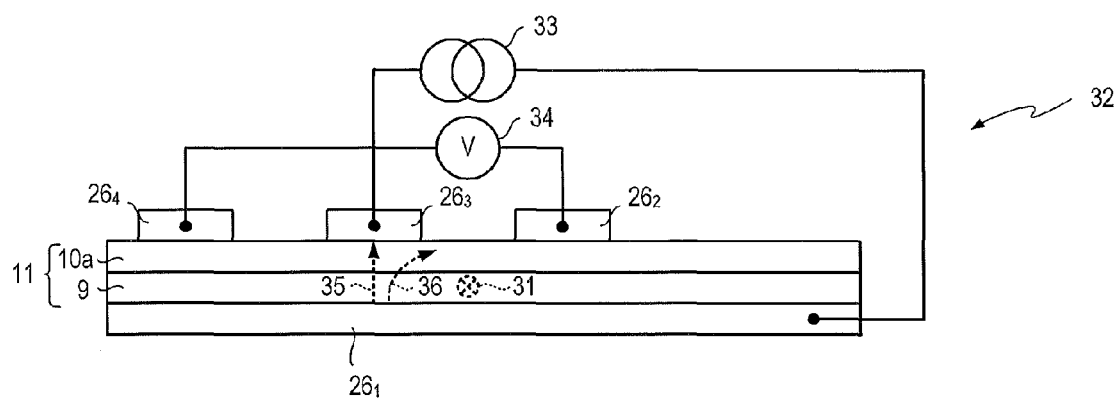
FIG. 15 is a schematic view of circuit arrangement for operating the fourth magnetoresistance device shown in FIG. 14.

Referring to FIG. 15, the circuit 32 for operating the magnetoresistance device 401 is shown. As shown in FIG. 15, the same arrangement as that used to operate the second device 201 (FIG. 10) can be used, i.e. a four-lead arrangement as shown in FIG. 11.

When a magnetic field 31 is applied, a voltage is induced between second and fourth leads $26_2$, $26_4$. Due the length of the channel 11, the induced voltage may comprise a Hall voltage component and a voltage difference component arising from bending of the current path 35 in the magnetic field 31.

The fourth device 401 is fabricated in a substantially similar way as the first device 1 (FIGS. 1 to 4). However, fabrication differs in two ways.

Firstly, the patterned resist layer 46 (FIG. 9e) has a different pattern, namely an 'L'-shaped pattern is used, rather than an elongate bar.

Secondly, the patterned resist layer 51 (FIG. 9I) has a different pattern. The pattern still defines three lead, but the leads are differently placed.

Fifth Magnetoresistance Device 501

Figure 16:
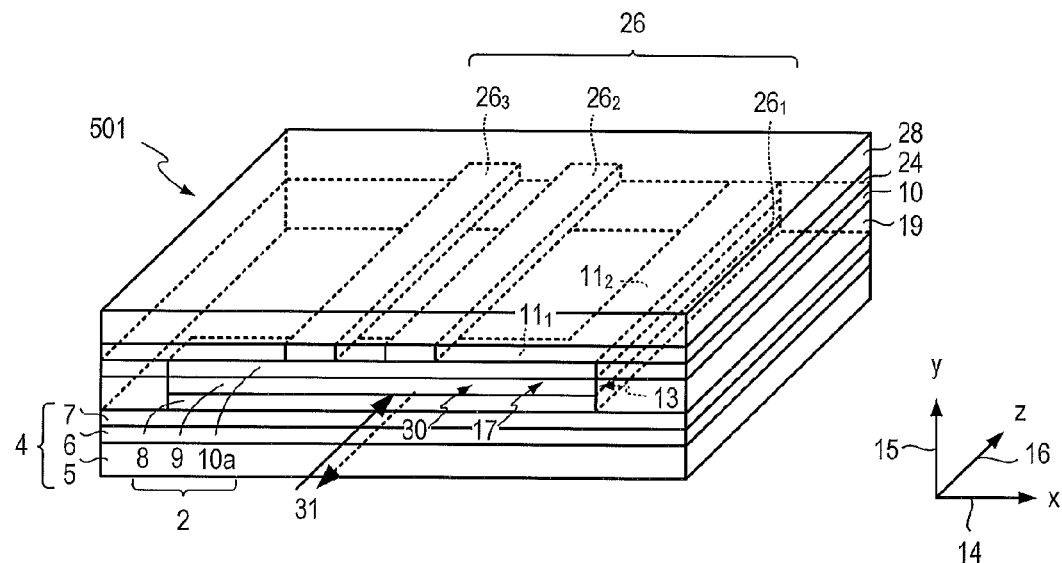
FIG. 16 is a schematic perspective view of a fifth magnetoresistance device.

Referring to FIG. 16, a fifth magnetoresistance device 501 is shown.

The fifth magnetoresistance device 501 is similar to the fourth magnetoresistance device 401 (FIG. 14) hereinbefore described. Therefore, the same reference numerals are used to refer to the same features.

Similar to the fourth device 401, the first lead $26_1$ is connected to the shunt 8 and the shunt 8 effectively becomes part of the first lead $26_1$. However, the fifth device 501 has only three leads 26, i.e. second and third leads $26_2$, $26_3$.

Similar to the fourth device 401, the lead $26_1$ may be patterned so that rather than providing a relatively long contact 27a similar to that shown in FIG. 14a, it provides a relatively short contact 27a' similar to that shown in FIG. 14b.

Figure 17:
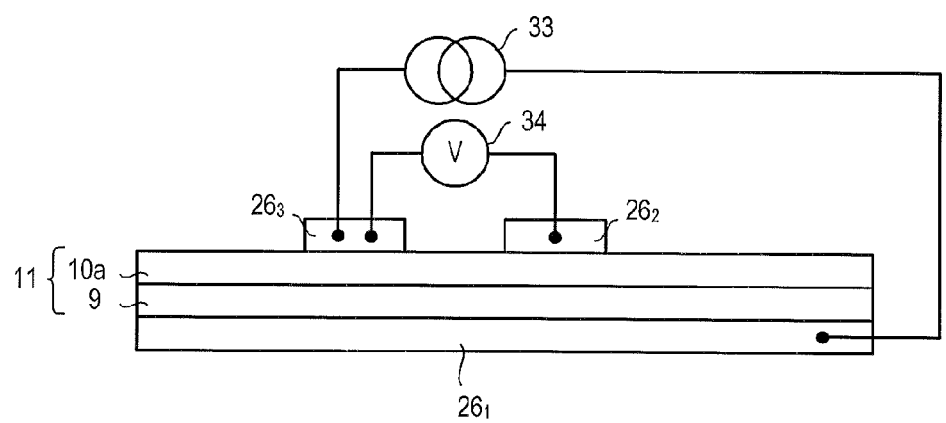
FIG. 17 is a schematic view of circuit arrangement for operating the fifth magnetoresistance device shown in FIG. 16.

Referring to FIG. 17, the circuit 32 for operating the magnetoresistance device 501 is shown. As shown in FIG. 17, the same arrangement as that used to operate the first device 1 (FIG. 1) can be used, i.e. a three-lead arrangement as shown in FIG. 4.

The fifth device 501 is fabricated in a substantially similar way as the first device 1 (FIG. 1). However, fabrication differs in two ways.

Firstly, the patterned resist layer 46 (FIG. 9e) has a different pattern, namely an 'L'-shaped pattern, rather than an elongate bar.

Secondly, the patterned resist layer 51 (FIG. 9I) has a different pattern. The pattern still defines three lead, but the leads are differently placed.

Sixth Magnetoresistance Device 601

Figure 18:
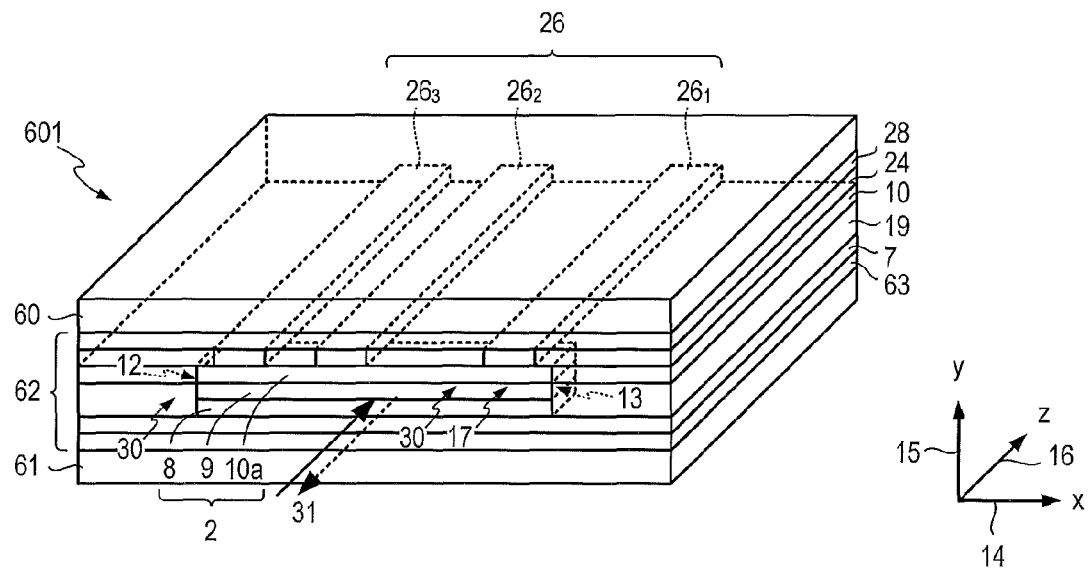
FIG. 18 is a schematic perspective view of a sixth magnetoresistance device.
Figure 19:
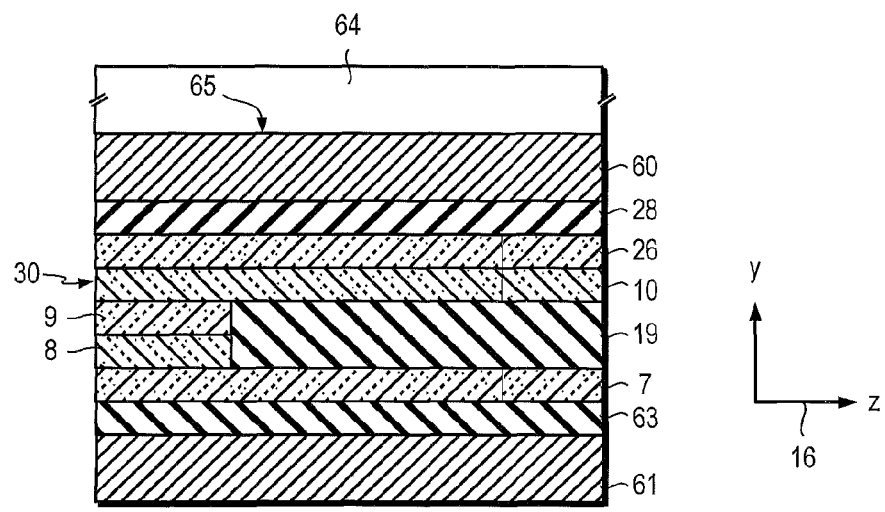
FIG. 19 is a cross-sectional view of the sixth magnetoresistance device shown in FIG. 18.

Referring to FIGS. 18 and 19, a sixth magnetoresistance device 601 is shown.

The sixth magnetoresistance device 601 is similar to the first magnetoresistance device 1 (FIG. 1) hereinbefore described. Therefore, the same reference numerals are used to refer to the same features.

The sixth device 601 differs in that first and second magnetic shield layers 60, 61 sandwich a vertical structure 62 comprising the shunt 8, channel 11, first patterned dielectric layer 19, second patterned dielectric layer 24, leads 26, and third dielectric layer 29. The sixth device 601 also differs in that the handle layer 5 (FIG. 1) is sacrificed, the buried insulator 6 (FIG. 1) is also sacrificed and replaced with a different, thicker dielectric layer 63. The device 601 is bonded to an aluminium titanium carbide wafer 64 (not shown in FIG. 18 for clarity) on a surface 65.

The same arrangement as that used to operate the first device 1 (FIG. 1) can be used to operate the sixth device 601.

Referring to FIGS. 20a to 20f, additional process stages for fabricating the sixth device 601 will now be described.

Figure 20A:
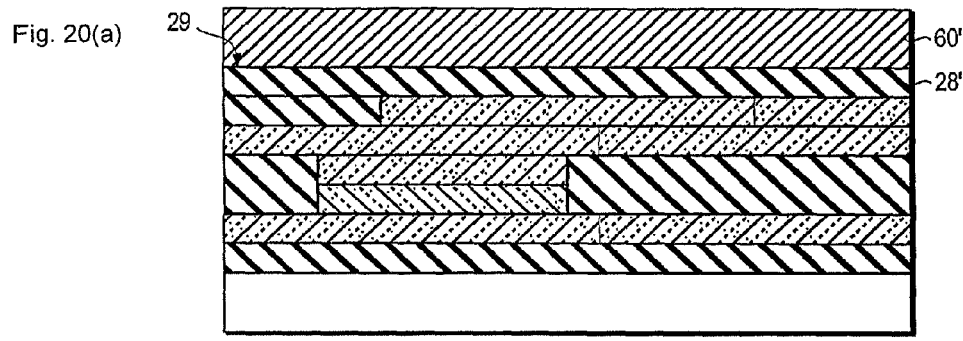
FIGS. 20a to 20f illustrates fabrication of the sixth magnetoresistance device shown in FIG. 18 at different stages during fabrication.

Referring in particular to FIG. 20a, a first magnetic shield layer 60' is deposited on an upper surface 29 of the third dielectric layer 29'. In this example, the magnetic shield layer 60' comprises permalloy (i.e. an alloy of nickel and iron) and is deposited by sputtering.

Figure 20B:
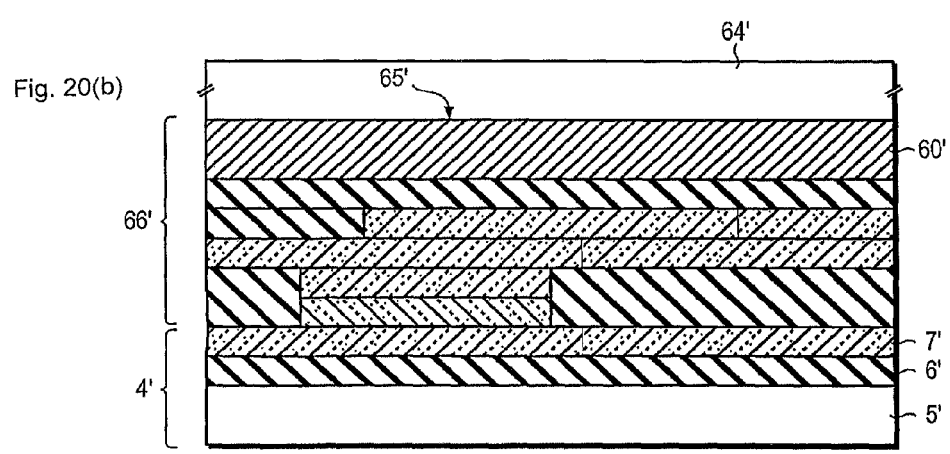

Referring FIG. 20b, the structure 66 is bonded to a wafer 64'. In this example, the wafer 64' takes the form of an aluminium titanium carbide ("AlTiC") wafer 64'. In particular, the wafer 64' is bonded to an upper surface 65' of the first magnetic shield layer 60'.

Figure 20C:
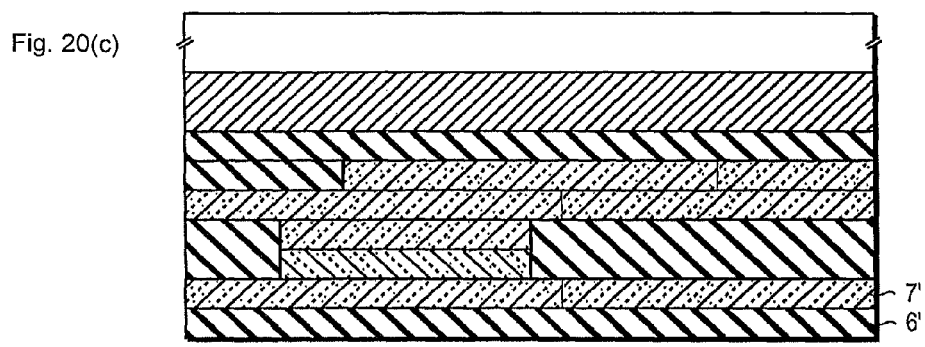

The handle layer 5' is etched back to the buried insulator layer 6'. The resulting structure is shown in FIG. 20c.

Figure 20D:
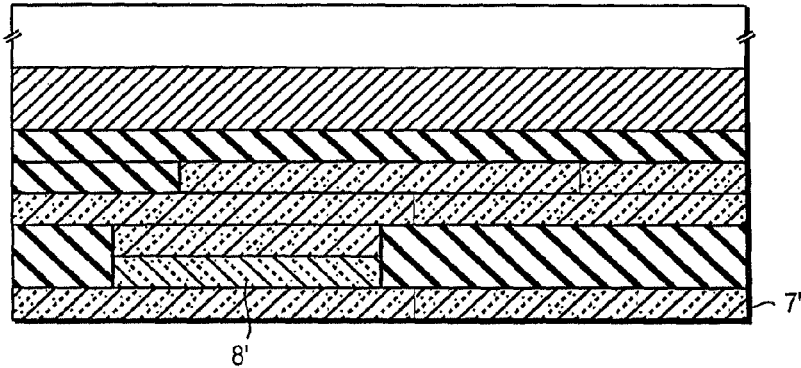

The buried insulator layer 6' is etched back to the seed layer 7'. The resulting structure is shown in FIG. 20d.

The seed layer 7' can be patterned using electron-beam lithography and wet etching so as to have the same or similar extend as the (wide) channel 11' or the (wide) shunt layer 8', and can be silicided, for example using nickel (Ni). The seed layer 7 can be patterned to provide a short-length contact 27a' (FIG. 14b) to the channel 11' or shunt layer 8'.

Figure 20E:
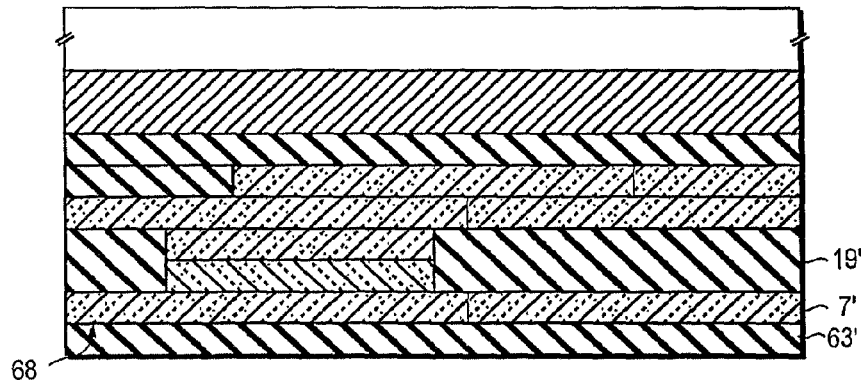

Referring to FIG. 20e, a new layer 63' of dielectric material is deposited over the underside 68 of the seed layer 7' or the underside (not shown) of the patterned, silicided seed layer (not shown) and first dielectric layer 19'. In this example, the dielectric material is silicon dioxide and is deposited using chemical vapour deposition (CVD).

Figure 20F:
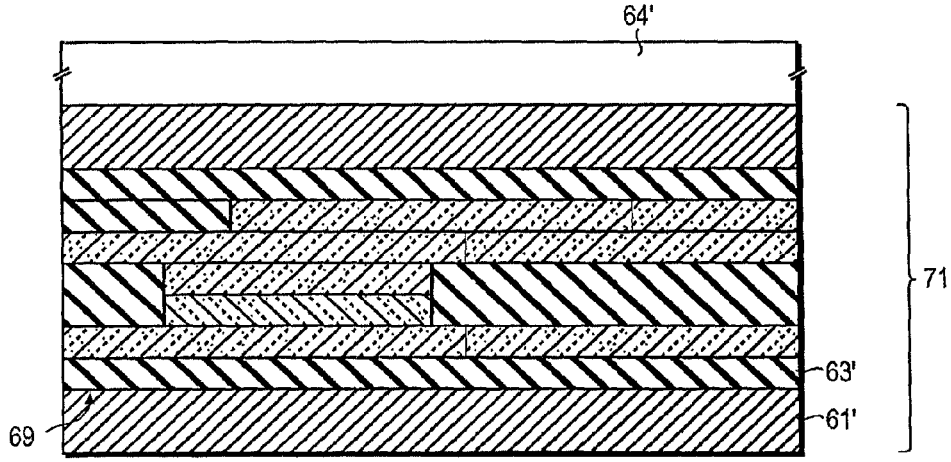

Referring to FIG. 20f, a second magnetic shield layer 61' is deposited on a lower surface 69 of the third dielectric layer 63'. In this example, the magnetic shield layer 61' comprises permalloy and is deposited by sputtering.

FIG. 20f shows the resulting device structure 71 on the wafer 64'.

At this point, the side face 30 (FIG. 18) can be formed by slicing the wafer into bars (not shown) and lapping the edges of the bars.

However, if the device 601 (FIG. 18) is intended to form part of a magnetic head slider 70 (FIG. 27), it is usual to fabricate the write head 72 (FIG. 25a) before the slicing and lapping steps are carried out. This will be described in more detail later.

Seventh Magnetoresistance Device 701

Figure 21:
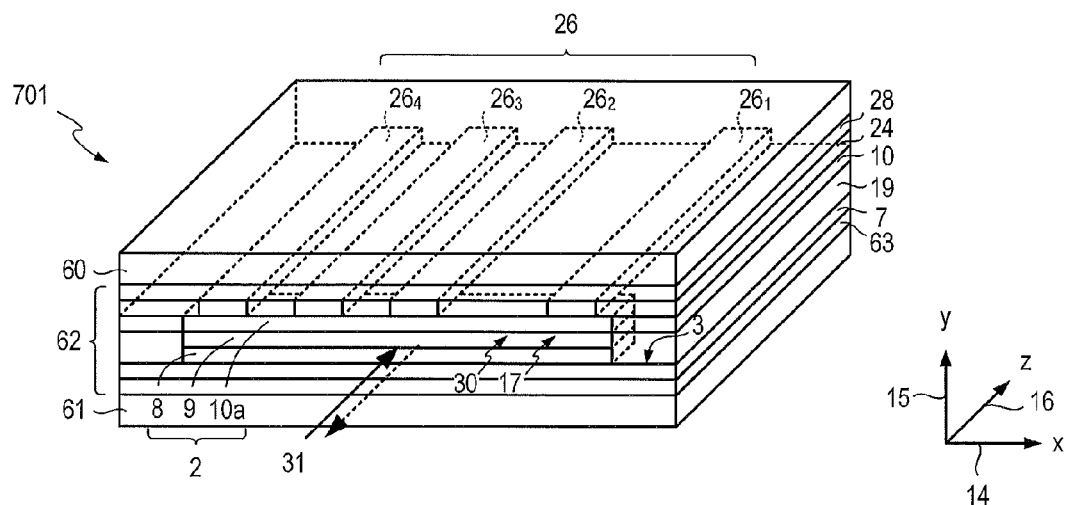
FIG. 21 is a schematic perspective view of a seventh magnetoresistance device.

Referring to FIG. 21, a seventh magnetoresistance device 701 is shown.

The seventh magnetoresistance device 701 is similar to the second magnetoresistance device 201 (FIG. 10) and sixth magnetoresistance device 601 (FIG. 18) hereinbefore described. Therefore, the same reference numerals are used to refer to the same features.

The seventh magnetoresistance device 701 differs from the sixth magnetoresistance device 601 (FIG. 18) in that it has four leads 26, namely first, second, third and fourth leads $26_1$, $26_2$, $26_3$, $26_4$. The spacing, $s_2$, between the third and fourth leads can be the same as the spacing, $s_2$, between the second and third leads. The layer structure 2 may be made longer in order to accommodate the number of lead 26.

The seventh device 701 can be operated in the same way as the second device 201.

The seventh device 701 is fabricated in substantially the same way as the sixth device 601 (FIG. 18). However, similar to the second magnetoresistance device 201 (FIG. 10), the patterned resist layer 51 (FIG. 9I) has a different pattern so as to form four, rather than three, leads 26.

Eighth Magnetoresistance Device 801

Figure 22:
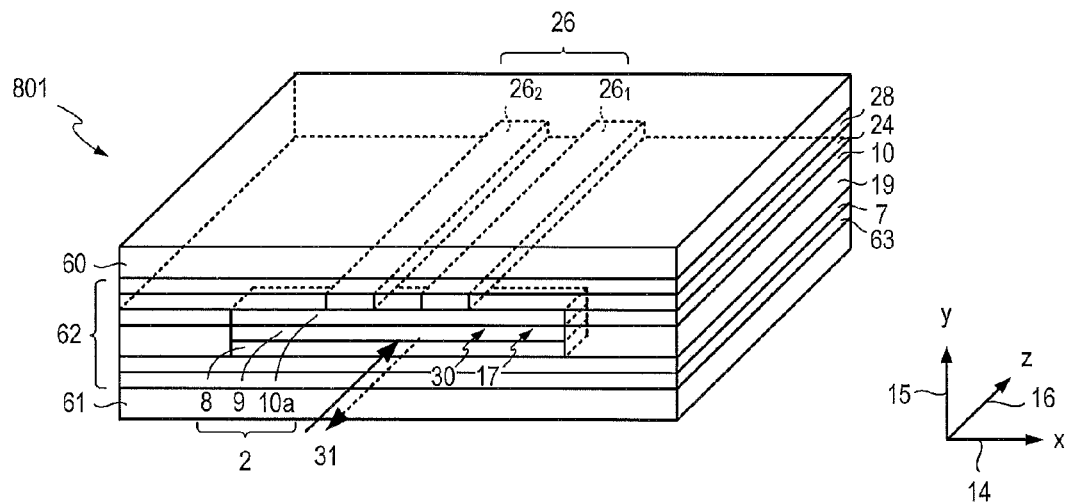
FIG. 22 is a schematic perspective view of an eighth magnetoresistance device.

Referring to FIG. 22, an eighth magnetoresistance device 801 is shown.

The eighth magnetoresistance device 801 is similar to the third magnetoresistance device 301 (FIG. 12) and sixth magnetoresistance device 601 (FIG. 18) hereinbefore described. Therefore, the same reference numerals are used to refer to the same features.

The eighth magnetoresistance device 801 is similar to the third magnetoresistance device 301 (FIG. 12) and differs from the sixth magnetoresistance device 601 (FIG. 18) in that it has two leads 26, namely first and second leads $26_1$, $26_2$.

The eighth magnetoresistance device 801 can be operated in the same way as the third device 301 (FIG. 12).

The eighth device 801 is fabricated in substantially the same way as the sixth device 601 (FIG. 18). However, similar to the third magnetoresistance device 301 (FIG. 12), the patterned resist layer 51 (FIG. 9I) has a different pattern so as to form two, rather than three, leads 26.

Ninth Magnetoresistance Device 901

Figure 23:
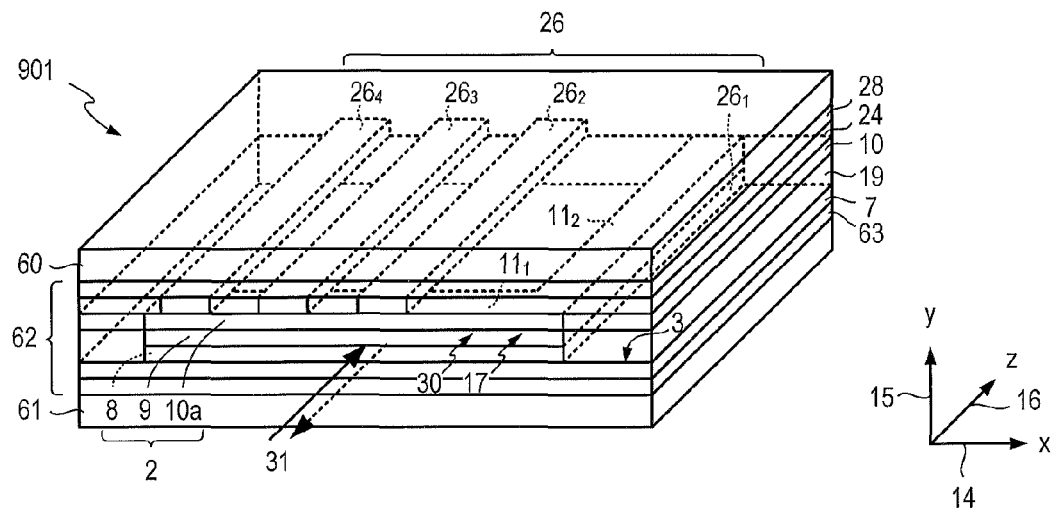
FIG. 23 is a schematic perspective view of a ninth magnetoresistance device.

Referring to FIG. 23, a ninth magnetoresistance device 901 is shown.

The ninth magnetoresistance device 901 is similar to the fourth magnetoresistance device 401 (FIG. 14) and sixth magnetoresistance device 601 (FIG. 18) hereinbefore described. Therefore, the same reference numerals are used to refer to the same features.

The ninth magnetoresistance device 901 is similar to the fourth magnetoresistance device 401 (FIG. 14) and differs from the sixth magnetoresistance device 601 (FIG. 18) in that the first lead $26_1$ is connected to the shunt 8 and the shunt 8 effectively becomes part of the first lead $26_1$.

The ninth magnetoresistance device 901 can be operated in the same way as the fourth device 401 (FIG. 14).

The ninth device 901 is fabricated in substantially the same way as the sixth device 601 (FIG. 18). However, similar to the fourth magnetoresistance device 401 (FIG. 14), the patterned resist layer 46 (FIG. 9e) has a different pattern, namely an 'L'-shaped pattern, rather than a straight bar and the patterned resist layer 51 (FIG. 9I) has a different pattern. The pattern still defines three lead, but the leads are differently placed.

Tenth Magnetoresistance Device 1001

Figure 24:
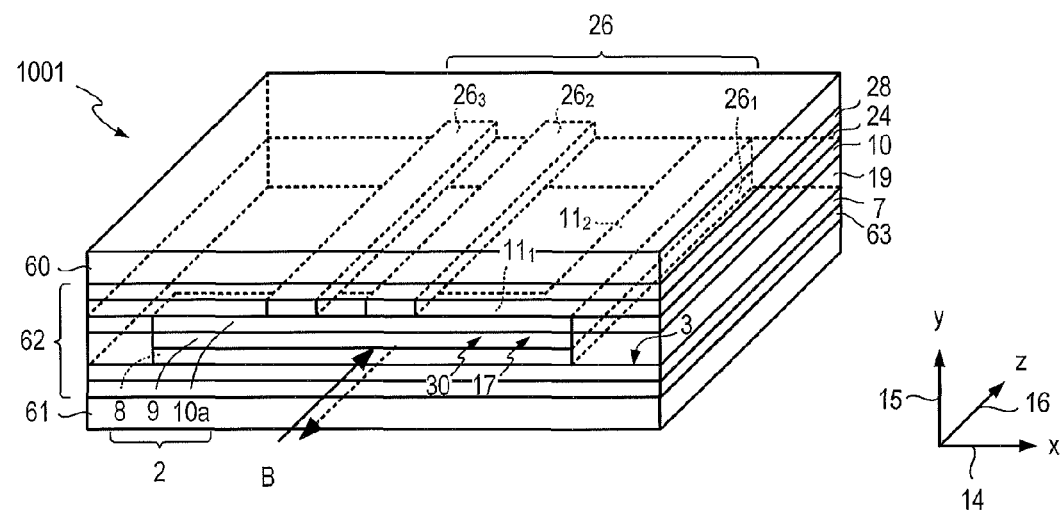
FIG. 24 is a schematic perspective view of a tenth magnetoresistance device.

Referring to FIG. 24, a tenth magnetoresistance device is shown.

The tenth magnetoresistance device 1001 is similar to the fifth magnetoresistance device 501 (FIG. 16) and sixth magnetoresistance device 601 (FIG. 18) hereinbefore described. Therefore, the same reference numerals are used to refer to the same features.

The tenth magnetoresistance device 1001 is similar to the fifth magnetoresistance device 501 (FIG. 16) and differs from the sixth magnetoresistance device 601 (FIG. 18) in that the first lead $26_1$ is connected to the shunt 8.

The tenth magnetoresistance device 1001 can be operated in the same way as the fifth device 501 (FIG. 16).

The tenth device 1001 is fabricated in substantially the same way as the sixth device 601 (FIG. 18). However, similar to the fifth magnetoresistance device 501 (FIG. 16), the patterned resist layer 46 (FIG. 9e) has a different pattern, namely an 'L'-shaped pattern, rather than a straight bar and the patterned resist layer 51 (FIG. 9I) has a different pattern. The pattern defines two leads.

Magnetic Head Slider

Figure 25:
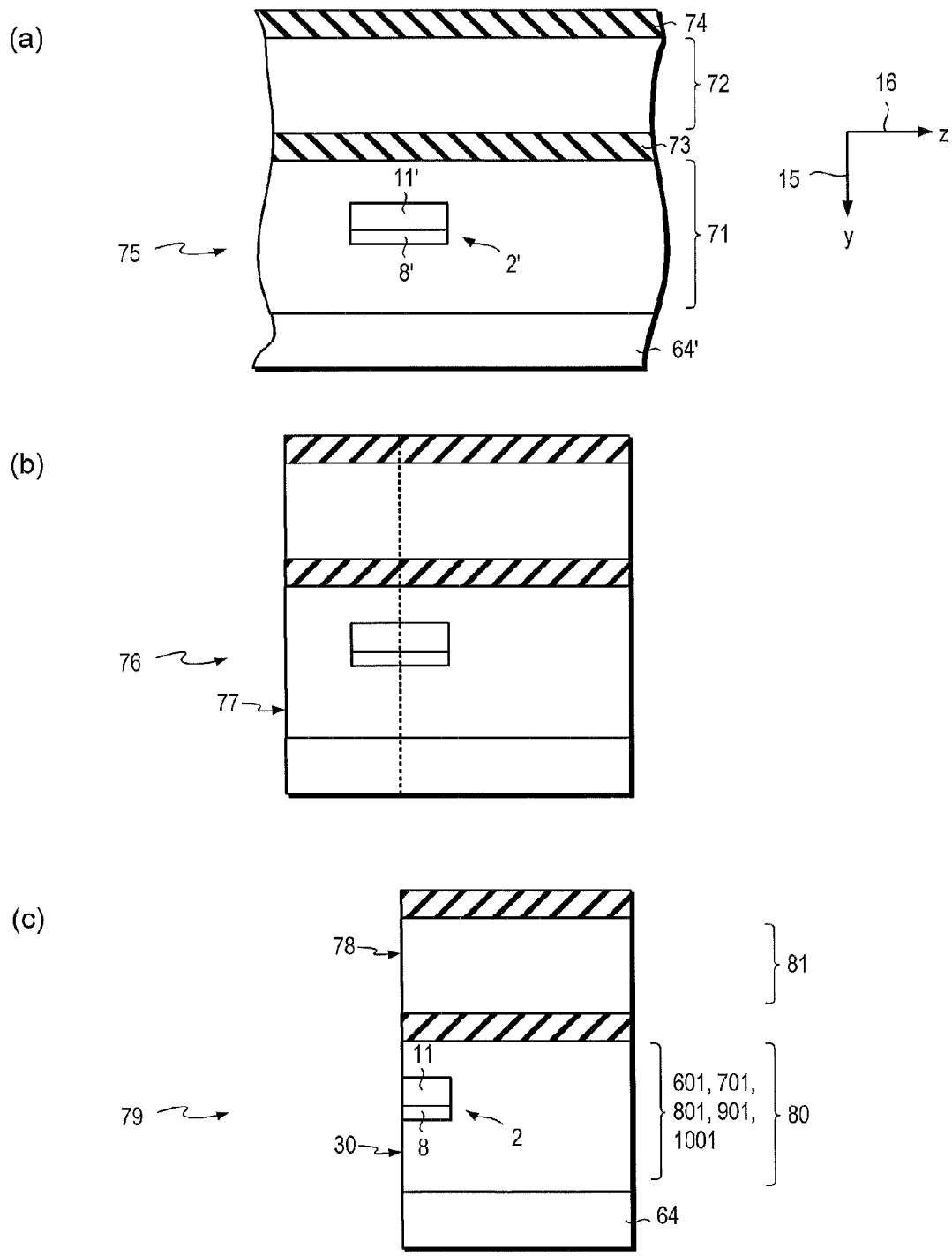
FIGS. 25a to 25c illustrate fabrication of a head element portion, which includes a magnetoresistance device, of a slider in a hard disk drive.
Figure 26:
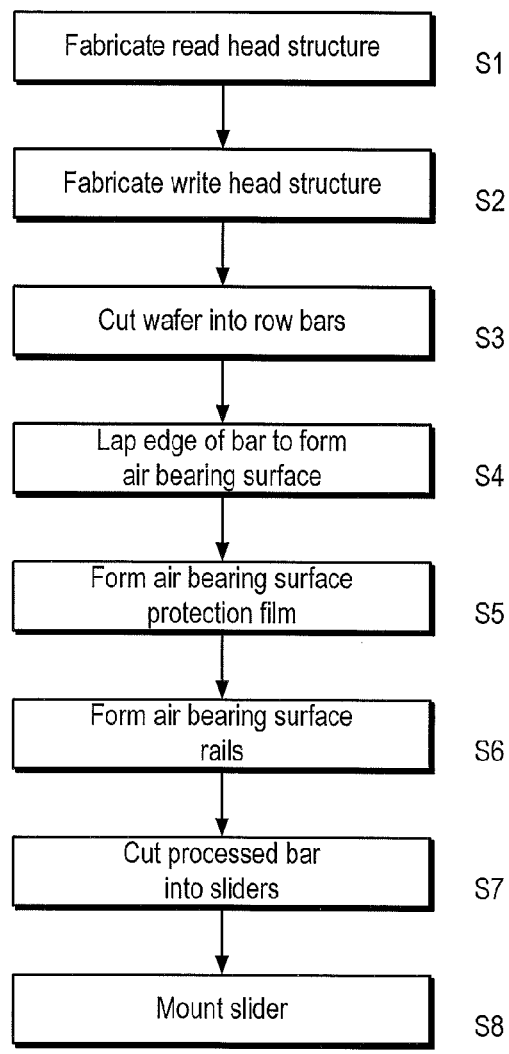
FIG. 26 is a process flow diagram of a method of fabricating a slider.

Referring to FIGS. 25 and 26, a method of fabricating a magnetic head slider 70 is shown.

A read head structure 71 is fabricated as hereinbefore described (step S1). As shown in FIG. 25a, the read head structure 71 includes an unlapped vertical layer structure 2' comprising unlapped channel 11' and optional shunt 8'.

The write head structure 72 is fabricated (step S2).

As shown in FIG. 25a, the read head structure 71 and write head structure 72 can be isolated from each other by a thick dielectric layer 73, e.g. comprising sputtered alumina ($Al_2O_3$). The write head structure 72 can also be protected by another thick dielectric layer 74.

Most of the devices hereinbefore described are illustrated with the contacts 27 on top of the channel 11 and the shunt 8 under the channel 11. However, the devices can be inverted and incorporated into a slider 70 so that the shunt 8 is on top of the channel and the contacts 27 lie under the channel 11. Thus, as shown in FIG. 25a, the read head structure 71 is inverted with respect to the read head structure 71 shown in FIG. 20f.

The processed wafer 75 is sliced into bars 76 which are elongate along the x-axis and have an edge 76 (step S3). Typically, a bar 76 support about fifty read heads and write heads.

The edge 77 is lapped to form the air bearing surface 78 including the side face 30 (step S4). A suitable lapping process is described in US 2002/0126421 A1 which is incorporated herein by reference.

FIG. 25c shows the resulting structure 79, herein referred to as the "head element portion", disposed on the bonded substrate 64. The head element portion 79 includes a read head 80, such as the sixth, seventh, eighth, ninth or tenth magnetoresistance device 601, 701, 801, 901, 1001, and a write head 81.

A protective film (not shown), for example having a thickness of a few nanometres, can be formed over the air the air bearing surface 78 (step S5). The air bearing surface rails are formed by dry etching (step S6). The processed row bar is cut into separate magnetic head sliders 70 (step S7). Finally, the magnetic head sliders 70 can be tested before being mounted on a suspension (step S8).

Referring to FIG. 27, the magnetic head slider 70 is shown in more detail.

As mentioned earlier, the head element portion 79 is formed on the substrate 64 and comprises the read head 80 and write head 81.

The air bearing surface 78 which includes a set of stepped surfaces 82, 83, 84 including a rail surface 82, a shallow groove surface 83 and a deep groove surface 84. The slider 70 has a leading face 85 and a trailing end 86.

Referring to FIG. 28, a magnetic disk drive 87 is shown.

The magnetic disk drive 87 comprises a housing 88 in which a stack of magnetic desk or "media" 89 (only one is shown for clarity) are mounted to a central hub 90 driven by a spindle motor (not shown).

Each magnetic disk 89 is provided with two sliders 70, one slider 70 for each side of the disk 89. Each slider 70 is attached to the tip of a respective suspension 91 which in turn are supported by respective arms 92 which are driven by an actuator 93.

Thus, a magnetic disk drive 87 can be provided with sliders 70 having a vertical-type magnetoresistance device such as those hereinbefore described.

It will be appreciated that many modifications may be made to the embodiments hereinbefore described.

For example, the channel 11 can be lightly doped p-type. Moreover, $Si_{1-x}Ge$ where x is, for example about 0.1, can be used instead of silicon.

Strained semiconductors, e.g. strained silicon, may be used.

Other semiconductor material systems can be used, such as III-V materials.

The channel may be undoped or doped with an impurity (n-type or p-type) up to a concentration of about $1 \times 10^{15}$ $cm^{-3}$, up to a concentration of about $1\times10^{16}$ cm$^{-3}$, up to a concentration of about $1\times10^{17}$ cm$^{-3}$ or up to a concentration of about $1\times10^{18}$ cm$^{-3}$.

The shunt and/or the leads may be doped with an impurity (n-type or p-type) having a concentration of at least about $1\times10^{19}$ cm$^{-3}$, or at least about $1\times10^{20}$ cm$^{-3}$, or at least about $1\times10^{21}$ cm$^{-3}$, for example about $1\times10^{21}$ cm$^{-3}$, and/or may comprise one or more δ-doped layers.

The channel and/or shunt may have a thickness between about 1 and 5 nm, a thickness between about 5 and 10 nm or a thickness between about 10 and 20 nm. The leads may have a thickness between about 1 and 5 nm, a thickness between about 5 and 10 nm, a thickness between about 10 and 20 nm or a thickness between about 20 nm and about 50 nm. The channel, shunt and leads may have different thicknesses.

The shunt may extend along a portion of the channel or vice versa, e.g. due to masking a part of the shunt before growing the first channel layer or by etching the first channel layer after growth. The shunt need not be rectangular.

The channel may have a width (i.e. W) between about 1 and 5 nm, a width between about 5 and 10 nm or a width between about 10 and 20 nm. The channel may have a length (i.e. L) of about 20 and 50 nm, between about 50 and 100 nm, between about 100 and 200 nm or between about 200 and 500 nm.

If the sensing area of the channel is small compared to the grain size in polycrystalline silicon, then a polycrystalline seed layer may be used.

End leads may be arranged to approach the channel from the ends of the channel, rather than perpendicularly. The device may include leads which are not used. For example, the device may comprise four or more leads, but fewer leads are used for driving and measuring signals through the channel.

Appropriate forms of CVD and suitable deposition conditions to provide selective and unselective deposition of semiconductor material, can be found by routine experiment. Other concentrations and mixtures for etches and developers may be used. Other etches (e.g. dry etches), resists and developers may be used. Etching, exposure and development times can be varied and can be found by routine experiment. Anneal temperatures may also be found by routine experiment.

The device need not exhibit an EMR effect, but can exhibit an MR effect, for example which employs the Lorentz force to bend a current path and/or uses the Hall effect.

The invention claimed is:

1. A magnetoresistance device comprising:
   a substrate having a surface;
   an elongate semiconductor channel extending in a first direction; and
   at least two conductive leads providing a set of contacts to the channel;
   wherein the channel and set of contacts are stacked relative to the substrate in a second direction which is perpendicular to the first direction and the surface of the substrate, wherein the device has a side face running along the channel and the device is responsive to a magnetic field generally perpendicular to the side face.

2. A device according to claim 1, further comprising a semiconductor shunt in contact with the channel, wherein the shunt, channel and set of contacts are stacked relative to the substrate in the second direction.

3. A device according to claim 2, wherein the channel is undoped or wherein the channel is doped less heavily than the shunt and has the opposite conductivity type to the shunt.

4. A device according to claim 2, wherein the shunt is monocrystalline.

5. A device according to claim 2, wherein the shunt comprises silicon.

6. A device according to claim 2, further comprising a conductive layer in contact with an optional shunt, wherein the optional shunt is interposed between the layer and the channel.

7. A device according to claim 6, wherein the conductive layer comprises silicon.

8. A device according to claim 6, wherein the conductive layer comprises a top layer of the substrate.

9. A device according to claim 6, wherein the conductive layer comprises a metal silicide.

10. A device according to claim 1, wherein the channel comprises a second semiconductor layer and part of a third semiconductor layer, the second semiconductor layer disposed between an optional shunt and the third semiconductor layer.

11. A device according to claim 10, wherein the second semiconductor layer and the third semiconductor layer part are monocrystalline and/or the other parts of the third semiconductor layer are amorphous.

12. A device according to claim 1, wherein the channel comprises silicon or silicon-germanium.

13. A device according to claim 1, further comprising a dielectric layer, the dielectric layer having a trench, wherein an optional shunt and at least a part of the channel are formed in the trench.

14. A device according to any claim 1, wherein the at least two leads comprise silicon and/or a metal silicide.

15. A device according to claim 1, further comprising an additional lead, the additional lead providing a further contact to the channel, wherein the channel is disposed between the further contact and the set of contacts.

16. A device according to claim 1, further comprising first and second magnetic field shielding layers, wherein an optional shunt, the channel and the set of contacts are disposed between the first and second magnetic field shielding layers.

17. A device according to claim 1, wherein the substrate comprises a magnetic head slider substrate, optionally, in the form of an AlTiC substrate.

18. A magnetic head slider for a magnetic disk drive, the slider comprising a device which comprises:
   a substrate having a surface;
   an elongate semiconductor channel extending in a first direction; and
   at least two conductive leads providing a set of contacts to the channel;
   wherein the channel and set of contacts are stacked relative to the substrate in a second direction which is perpendicular to the first direction and the surface of the substrate, wherein the device has a side face running along the channel and the device is responsive to a magnetic field generally perpendicular to the side face.

19. A magnetic disk drive comprising:
   a housing;
   a magnetic media mounted within the housing;
   a magnetic head slider according to claim 18, wherein the slider is held within the housing for movement adjacent to the magnetic media.

* * * * *